United States Patent
Mukunoki et al.

(10) Patent No.: US 7,075,839 B2
(45) Date of Patent: Jul. 11, 2006

(54) SEMICONDUCTOR MEMORY DEVICE

(75) Inventors: Toshio Mukunoki, Nara (JP); Akira Sugimoto, Osaka (JP); Takao Ozeki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/821,983

(22) Filed: Apr. 12, 2004

(65) Prior Publication Data

US 2004/0208071 A1  Oct. 21, 2004

(30) Foreign Application Priority Data

Apr. 17, 2003  (JP) .............. 2003-112576

(51) Int. Cl.
*G11C 7/00* (2006.01)
(52) U.S. Cl. ................... 365/201; 365/185.26
(58) Field of Classification Search ............... 365/201, 365/185.01, 185.26, 185.1

See application file for complete search history.

(56) References Cited

U.S. PATENT DOCUMENTS

| 5,268,869 A * | 12/1993 | Ferris et al. ............... 365/210 |
| 5,408,433 A * | 4/1995 | Hashimoto ............. 365/185.21 |
| 6,414,890 B1 | 7/2002 | Arimoto et al. |
| 6,444,514 B1 * | 9/2002 | Nishimoto et al. ......... 438/221 |
| 6,646,911 B1 * | 11/2003 | Hidaka ....................... 365/173 |
| 2004/0145959 A1 * | 7/2004 | Kuge et al. ............ 365/230.03 |

FOREIGN PATENT DOCUMENTS

JP  10-302498  11/1998

* cited by examiner

*Primary Examiner*—Richard Elms
*Assistant Examiner*—Eric J. Wendler
(74) *Attorney, Agent, or Firm*—McDermott Will & Emery LLP

(57) ABSTRACT

A memory cell array includes a memory cell region composed of memory cells and a sample cell region composed of word line sample cells and bit line sample cells. The word line sample cell and the bit line sample cell are formed so that by a voltage applied to word lines and bit lines, charge transfer from the floating gate electrode occurs more easily than the memory cell.

20 Claims, 18 Drawing Sheets

SEMICONDUCTOR MEMORY DEVICE

BACKGROUND OF THE INVENTION (a) Field of the Invention

The present invention relates to semiconductor memory devices including electrically programmable nonvolatile memory cells. In particular, the present invention relates to semiconductor memory devices adapted for a test method for checking the nonvolatile memory cells for failure using a burn-in process.

(b) Description of Related Art

Conventionally, as semiconductor memory devices in which data is stored in elements integrated on a semiconductor substrate, nonvolatile semiconductor memory devices are used which can retain data even when power is not supplied. Particularly, flash EEPROMs capable of electrically writing and erasing data are commonly used which have a floating gate electrode with the surrounding thereof insulated by an oxide film or the like and a control gate electrode formed above the floating gate electrode with a capacitor insulating film interposed therebetween.

(First Conventional Example)

FIG. 17 shows the block configuration of a flash EEPROM according to a first conventional example. As shown in FIG. 17, the flash EEPROM of the first conventional example is provided with a memory cell array 101 in which memory cells $MC_{11}$ to $MC_{mn}$ are arranged in matrix. The flash EEPROM is further provided with, as peripheral circuits for driving the memory cell array 101, a word line driver 102 for driving word lines $WL_1$ to $WL_m$, a bit line driver 103 for driving bit lines $BL_1$ to $BL_n$, and a source line driver 104 for driving a source line SL.

Each of the memory cells $MC_{11}$ to $MC_{mn}$ includes a floating gate electrode, a control gate electrode, and two doped regions. The floating gate electrode is formed above a semiconductor substrate with a tunnel insulating film interposed therebetween. The control gate electrode is formed above the floating gate electrode with a capacitor insulating film interposed therebetween. The two doped regions are formed to interpose a portion of the semiconductor substrate located below the floating gate electrode, and they serve as a source electrode and a drain electrode.

As the tunnel insulating film, use is made of a silicon oxide film with few crystal defects formed by thermal oxidation. As the capacitor insulating film, use is made of an ONO film formed by sequentially stacking a first silicon oxide film, a silicon nitride film, and a second silicon oxide film.

The flash EEPROM of the first conventional example stores, as data, electric charges accumulated in the floating gate electrodes of the memory cells $MC_{11}$ to $MC_{mn}$.

The flash EEPROM of the first conventional example performs writing operation on, for example, the memory cell $MC_{11}$ in the following manner. The word line driver 102 and the bit line driver 103 select a memory cell to be targeted for writing operation, and the drivers apply control voltages of, for example, about 5 V to the word line $WL_{11}$ and the bit line $BL_{11}$, respectively. Thus, charges in the source electrode are injected through the tunnel insulating film into the floating gate electrode.

The flash EEPROM performs reading operation on the memory cell $MC_{11}$ in the following manner. The bit line $BL_{11}$ is precharged and a control voltage of, for example, about 2.5 V is applied to the word line $WL_{11}$. The threshold of the control gate voltage at which current starts to flow in a channel region differs according to the amount of charges stored in the floating gate electrode. If the threshold voltage of the memory cell $MC_{11}$ is lower than the voltage applied to the control gate electrode, the direction of the potential of the bit line $BL_{11}$ is changed to the positive direction. On the contrary, if the threshold voltage thereof is higher than the voltage applied to the control gate electrode, the direction of the potential of the bit line $BL_{11}$ is changed to the negative direction.

The flash EEPROM performs erasing operation on the memory cell $MC_{11}$ in the following manner. A control voltage of, for example, about −5 V is applied to the word line $WL_{11}$ and a control voltage of about 5 V is applied to the source line SL. Thus, erasing operation is performed at a time on all the memory cells $MC_{11}$ to $MC_{1n}$, connected to the word line $WL_{11}$.

In writing operation or reading operation of a nonvolatile semiconductor memory device including memory cells, the same control voltage is applied not only to memory cell targeted for the operation but also to memory cells connected to the common word line or the common bit line with the target memory cell. By this control voltage, charges accumulated in the floating gate electrode may leak (may be disturbed) through the capacitor insulating film or the tunnel insulating film to the semiconductor substrate side or the control gate electrode side, and then data in the device might be corrupted.

To prevent such a possible problem and ensure the reliability of the flash EEPROM, a disturb test is conducted for checking whether the memory cells can store data with reliability for a predetermined period of time and screening early failures in the EEPROM.

The disturb test includes the process (burn-in process) in which using a burn-in apparatus, a voltage acting as a stress is applied to word lines or bit lines for a predetermined period of time and the process in which data stored in the memory cell is checked for corruption by the stress application.

Specifically, in advance, a prescribed data is written in a memory cell array in a flash EEPROM. First, the EEPROM is connected to a burn-in apparatus. A voltage as a stress supplied from the burn-in apparatus is applied to all the word lines $WL_1$ to $WL_m$ or all the bit lines $BL_1$ to $BL_n$ for a predetermined period of time. Although not shown, the flash EEPROM of the first conventional example is provided with a burn-in test circuit as a circuit for controlling the stress application process (burn-in process) with the burn-in apparatus, and operations of the word line driver 103 and the bit line driver 104 are controlled based on the control signal from the burn-in apparatus.

Subsequently, data in the memory cell is read out with a tester or the like, and the data is checked for variation caused during the stress application. If the stress application varies the data in the memory cell, the memory cell is judged to be failure.

If the word line driver 103 or the bit line driver 104 in the flash EEPROM of the first conventional example has early failure, however, a stress as predetermined may not be applied in the burn-in process described above. In this case, because of an inadequate stress application, even a memory cell with a low disturb property is erroneously judged to be normal.

(Second Conventional Example)

To prevent such a misjudgment, in a second conventional example, a means for determining whether or not a predetermined voltage is applied to the word lines and the bit lines is provided.

For example, Japanese Unexamined Patent Publication No. 10-302498 discloses an EPROM in which a circuit for measuring a bit line potential is provided as a means for detecting whether or not a predetermined voltage is applied to bit lines in a writing test. In the second conventional example, a circuit similar to the bit-line-potential measurement circuit described in this publication is provided, thereby enabling measurement of a bit line potential and a word line potential.

FIG. 18 is a block diagram showing how to conduct a disturb test on a flash EEPROM of the second conventional example. As shown in FIG. 18, in a flash EEPROM 110 of the second conventional example, a word line driver 102 and a bit line driver 103 are controlled by a burn-in test circuit 111 which receives a control signal and a stress voltage from a burn-in apparatus 200 to control a burn-in process.

The flash EEPROM 110 is connected through a burn-in board (not shown) to the burn-in apparatus 200. A plurality of flash EEPROMs 110 are arranged on one burn-in board, and a plurality of burn-in boards are connected to the burn-in apparatus 200. Therefore, a stress is applied at a time to a number of flash EEPROMs 110.

When a stress is applied to the word lines $WL_1$ to $WL_m$, word line selection transistors $WST_1$ to $WST_m$ are sequentially turned on and a word-line-potential measurement circuit 112 sequentially measures voltages applied to the word lines $WL_1$ to $WL_m$. The result of each measurement is supplied to a selector circuit 114.

Likewise, when a stress is applied to the bit lines $BL_1$ to $BL_n$, bit line selection transistors $BST_1$ to $BST_n$ are sequentially turned on and a bit-line-potential measurement circuit 113 sequentially measures voltages applied to the bit lines $BL_1$ to $BL_n$. The result of each measurement is supplied to the selector circuit 114.

The selector circuit 114 selectively supplies to a comparator 201 the measurement results received from the word-line-potential measurement circuit 112 and the bit-line-potential measurement circuit 113. The comparator 201 determines whether or not the applied voltage is identical to the prescribed voltage. Based on the output from the comparator 201, the burn-in apparatus 200 adjusts a stress voltage to be applied to the word lines $WL_1$ to $WL_m$ and the bit lines $BL_1$ to $BL_n$ so that a voltage as prescribed is applied to the word lines $WL_1$ to $WL_m$ and the bit lines $BL_1$ to $BL_n$.

However, the second conventional example includes not only the word-line-potential measurement circuit 112 and the bit-line-potential measurement circuit 113 but also a signal line and a control circuit for separately controlling the bit line selection transistors $BST_1$ to $BST_n$ and the word line selection transistors $WST_1$ to $WST_m$. Therefore, the chip area of the flash EEPROM extremely increases. Moreover, the burn-in apparatus 200 has to be provided with the comparators 201 equal in number to the EEPROMs to be tested at a time, so that costs necessary for the burn-in apparatus 200 increase as well.

As described above, the conventional flash EEPROM has the problem in which a reliable implementation of the disturb test results in increases in the chip cost and the test cost of the flash EEPROM.

SUMMARY OF THE INVENTION

An object of the present invention is to solve the conventional problem mentioned above and to provide a semiconductor memory device in which means for determining whether or not a voltage as prescribed is applied in a disturb test on a semiconductor memory device is provided without increasing the chip area of the device and at a low cost.

To accomplish the above object, a semiconductor memory device of the present invention is provided not only with a first memory cell for storing data but also a second memory cell for detecting (sampling) the voltage of a stress applied to a bit line and a word line.

To be more specific, a first semiconductor memory device of the present invention comprises: a plurality of first memory cells (memory cells) arranged in matrix; a control line (a word line or a bit line) connecting a subset of the plurality of first memory cells which are aligned in a row direction or a column direction; and a second memory cell (a sample cell) connected to the control line. The second memory cell is configured to retain information on a stress applied from the control line to the first memory cells.

With the first semiconductor memory device of the present invention, in a disturb test, check on the stress information retained in the second memory cell after a burn-in process can determine whether a normal stress has been applied or not. Therefore, unlike the flash EEPROM of the second conventional example, there is no need to appropriately determine whether the stress voltage is normal or not during the stress voltage application in the burn-in process of the disturb test and then to perform the burn-in process again. This simplifies processes of the disturb test. Moreover, whether the applied stress is normal or not can be determined by the stress information retained in the second memory cell, which eliminates the necessity to provide a comparator in the burn-in apparatus. Furthermore, in the first semiconductor memory device of the present invention, since the second memory cell alone is added to the first memory cells for storing data, the chip area of the device hardly increases.

A second semiconductor memory device of the present invention comprises: a plurality of first memory cells (memory cells) arranged in matrix; a plurality of word lines each connecting a subset of the plurality of first memory cells which are aligned in a row direction; a plurality of bit lines each connecting a subset of the plurality of first memory cells which are aligned in a column direction; and a plurality of second memory cells (sample cells) which are connected to at least either of the word lines and the bit lines. The first memory cells and the second memory cells each have a charge storage portion for storing charges. When voltage application to the word lines or the bit lines changes the amounts of charges stored in the charge storage portions of the first memory cells and the second memory cells, the amount of change in charges in the second memory cell is larger than the amount of change in charges in the first memory cell.

In the second semiconductor memory device of the present invention, the amount of change in charges in the second memory cell is larger than the amount of change in charges in the first memory cell. Therefore, in a disturb test on the first memory cell, measurement of the threshold voltage of the second memory cell after a burn-in process can determine whether a normal stress has been applied or not. As a result, unlike the flash EEPROM of the second conventional example, there is no need to appropriately determine whether the stress voltage is normal or not during the stress voltage application in the burn-in process in the disturb test and then to perform the burn-in process again. This simplifies processes of the disturb test. Moreover, measurement of the threshold voltage of the second memory cell can determine whether the applied stress is normal or not, which eliminates the necessity to provide a comparator in the burn-in apparatus. Furthermore, in the second semiconductor memory device of the present invention, since only the second memory cells are added to the first memory cells for storing data, the chip area of the device hardly increases.

Preferably, in the second semiconductor memory device of the present invention, the first memory cells and the second memory cells each have a floating gate electrode which is formed, as the charge storage portion, above a semiconductor substrate with a tunnel insulating film interposed therebetween, a control gate electrode formed above the floating gate electrode with a capacitor insulating film interposed therebetween, and a source electrode and a drain electrode provided to interpose a portion of the semiconductor substrate located below the floating gate electrode, and the first memory cells differ from the second memory cells in the composition or the shape of at least one of the tunnel insulating film, the floating gate electrode, the capacitor insulating film, and the control gate electrode. In this structure, by modifying part of members constituting the first memory cell and the second memory cell, the first memory cell and the second memory cell can be formed so that the amount of change in charges in the second memory cell is larger than that in the first memory cell. This provides the commonality of the formation process between the first memory cell and the second memory cell, thereby enabling formation of the second memory cell at a low cost.

In this case, the capacitor insulating films of the second memory cells preferably have a lower resistivity than the capacitor insulating films of the first memory cells. With this structure, charges in the second memory cell transfer easily from the floating gate electrode through the capacitor insulating film. Therefore, when a voltage serving as a stress is applied to the control gate electrode, the amount of charges stored in the floating gate electrode of the first memory cell hardly varies, while the amount of charges stored in the floating gate electrode of the second memory cell remarkably varies.

In this case, preferably, the capacitor insulating films of the first memory cells are each formed as a stacked film containing a silicon oxide film and a silicon nitride film, and the capacitor insulating films of the second memory cells are each formed as a single layer film or a stacked film containing a silicon oxide film. With this structure, the capacitor insulating film of the second memory cell has a lower resistivity than the capacitor insulating film of the first memory cells. Therefore, the amount of charges stored in the floating gate electrode of the first memory cell hardly varies, while the amount of charges stored in the floating gate electrode of the second memory cell remarkably varies.

When the floating gate electrode described above is provided in the device, preferably, the floating gate electrodes of the first memory cells are each formed to have a smooth upper surface, and the floating gate electrodes of the second memory cells are each formed to have an upper surface with projections and depressions. With this structure, when a voltage serving as a stress is applied to the word line, an electric field is concentrated at the projections of the floating gate electrode. Therefore, charges in the second memory cell transfer easily from the floating gate electrode through the capacitor insulating film. As a result, when a stress is applied to the word line or the bit line, the amount of charges stored in the floating gate electrode of the first memory cell hardly varies, while the amount of charges stored in the floating gate electrode of the second memory cell remarkably varies.

When the floating gate electrode and the control gate electrode described above are provided in the device, preferably, the second memory cells are larger than the first memory cells in terms of the ratio of the area in which the floating gate electrode and the control gate electrode face each other with the capacitor insulating film interposed therebetween to the area in which the semiconductor substrate and the floating gate electrode face each other with the tunnel insulating film interposed therebetween. With this structure, the capacitive coupling ratio of the second memory cell is larger than that of the first memory cell. Therefore, in the second memory cell, charge transfer from the floating gate electrode through the capacitor insulating film occurs more readily than in the first memory cell. Consequently, when a voltage is applied to the word line or the bit line, the amount of charges stored in the floating gate electrode of the first memory cell hardly varies, while the amount of charges stored in the floating gate electrode of the second memory cell remarkably varies.

Preferably, the second semiconductor memory device of the present invention further comprises switch means for separating electrical connections between the word lines or the bit lines and the second memory cells. With this structure, the second memory cell can be separated from the first memory cell after the disturb test is completed. Therefore, in a normal operation, the first memory cell can be protected against influences of the second memory cell.

In this case, the switch means is preferably a fuse element.

Furthermore, the switch means is preferably a MIS transistor.

In the case where the switch means is a MIS transistor, preferably, at least one of the first memory cells stores control information with which turn-on or turn-off of the MIS transistor is controlled. With this structure, information with which the MIS transistor is turned off is written in the first memory cell after the disturb test is completed. This enables control such that the electrical connection between the first memory cell and the second memory cell is separated in a normal operation.

In the second semiconductor memory device of the present invention, preferably, the plurality of second memory cells are arranged with two or more being connected in serial on each of the word and/or bit lines. With this structure, in determining whether the applied stress is normal or not in the disturb test, the threshold voltage of each of the second memory cells arranged in plural can be measured to reduce influences of variations in characteristics of the second memory cells.

Preferably, the second semiconductor memory device of the present invention further comprises an equalization circuit for equalizing pieces of data regarding the amount of charges stored in the second memory cells provided in plural and supplying the equalization result. With this structure, there is no need to measure the threshold voltage of each of the second memory cells arranged in serial on the word lines or the bit lines, and processes of the test are simplified in the case of reducing influences of variations in characteristics of the second memory cells.

In the second semiconductor memory device of the present invention, preferably, the plurality of second memory cells are arranged with two or more being connected in parallel on each of the word and/or bit lines. With this structure, the threshold voltage of each of the second memory cells arranged in parallel can be measured to conduct a more precise disturb test.

Preferably, the second semiconductor memory device of the present invention further comprises switch transistors for controlling connections between the second memory cells and at least either of the word lines and the bit lines. With this structure, the second memory cells arranged in parallel can be controlled to have different stress application times, thereby enabling a more precise disturb test.

Preferably, the second semiconductor memory device of the present invention further comprises: a first verification circuit for determining whether or not a writing operation or an erasing operation is normally performed on the first memory cells; and a second verification circuit for determining whether or not a writing operation or an erasing operation is normally performed on the second memory cells. With this structure, the amounts of charges stored in the charge storage portions of the first and second memory cells are independently adjusted with the first and second verification circuits, respectively. Therefore, the amounts of charges in the two cells can be controlled so that the second memory cell is larger than the first memory cell in the difference between the amount of charges stored in a writing state or an erasing state and the amount of charges stored in a neutral state. Thus, the threshold voltage of the second memory cell varies more easily than that of the first memory cell, so that the second memory cell can be used to monitor a stress applied to the word line or the bit line.

Preferably, the second semiconductor memory device of the present invention further comprises: a first source line connected to source electrodes of the first memory cells; and a second source line connected to source electrodes of the second memory cells. With this structure, only the second memory cell can be subjected to erasing operation. Therefore, prior to the burn-in process, writing operation and erasing operation are repeatedly performed only on the second memory cell, whereby endurance properties of the second memory cell can be degraded as compared to the first memory cell. This makes the stress applied to the second memory cell larger than that of the first memory cell. Thus, the threshold voltage of the second memory cell varies more easily than that of the first memory cell, so that the second memory cell can be used to monitor a stress applied to the word line or the bit line.

In the second semiconductor memory device of the present invention, the first memory cells and the second memory cells are preferably formed of the same members. With this structure, there is no need to provide any particular process for fabricating the second memory cell, which reduces a fabrication cost of the semiconductor memory device.

Preferably, in the second semiconductor memory device of the present invention, the plurality of second memory cells are arranged with two or more being connected in serial on each of the word and/or bit lines, and the two or more second memory cells connected in serial includes an identically-shaped cell formed of the same members as the first memory cells and a differently-shaped cell formed of different members from the first memory cells. With this structure, the identically-shaped cell and the differently-shaped cell can be used to monitor a stress with two types of methods. Therefore, a more precise disturb test can be conducted.

BRIEF DESCRIPTION OF THE DRAWINGS

FIG. 3A is a graph showing the threshold voltage distributions in the state before stress application, and FIG. 3B is a graph showing the threshold voltage distributions in the state after stress application.

DETAILED DESCRIPTION OF THE PREFERRED EMBODIMENTS (First Embodiment)

A first embodiment of the present invention will be described with reference to the accompanying drawings.

Figure 1:
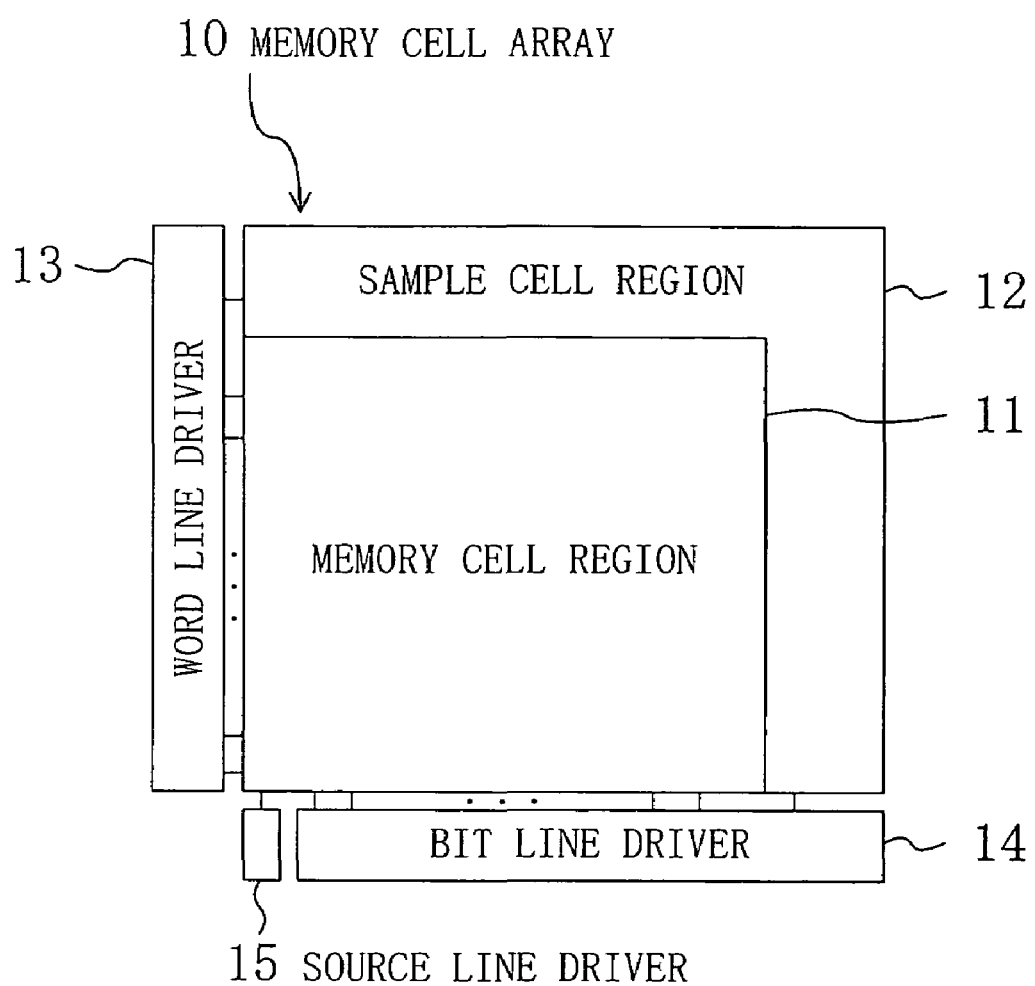
FIG. 1 is a block diagram showing a semiconductor memory device according to a first embodiment of the present invention.

FIG. 1 shows the block configuration of a semiconductor memory device according to the first embodiment of the present invention. Referring to FIG. 1, the semiconductor memory device of the first embodiment includes a memory cell array 10 in which a plurality of memory cells are arranged in matrix. The memory cell array includes a memory cell region 11 for storing data and a sample cell region 12 for monitoring a stress applied in a disturb test. The memory cell array 10 is further provided with, as peripheral circuits for driving the memory cell array 10, a word line driver 13 for driving word lines in the memory cell region 11 and a word line in the sample cell region 12 (referred hereinafter to as a sample word line), a bit line driver 14 for driving bit lines in the memory cell region 11 and a bit line in the sample cell region 12 (referred hereinafter to as a sample bit line), and a source line driver 15 for driving a source line common to the memory cell region 11 and the sample cell region 12.

Memory cells and sample cells constituting the memory cell array 10 are each formed as a stacked type EEPROM cell which accumulates charges in its floating gate electrode with the surrounding thereof insulated and which reads data by adjusting the amount of current flowing between a source and a drain by a control gate electrode of the cell.

Figure 2:
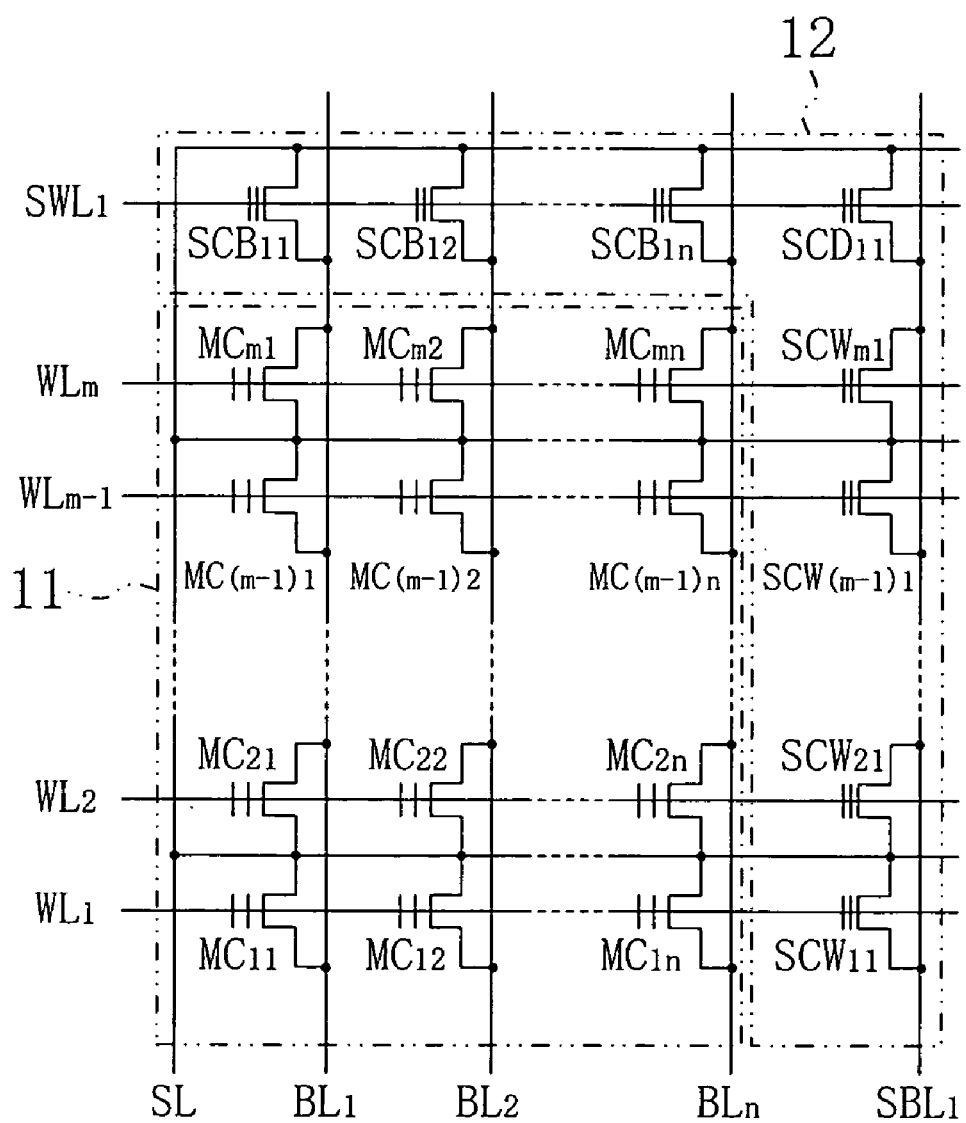
FIG. 2 is a circuit diagram showing a memory cell array of the semiconductor memory device according to the first embodiment of the present invention.

FIG. 2 shows the circuit configuration of the memory cell array 10. Referring to FIG. 2, the memory cell region 11 is composed of a plurality of memory cells $MC_{11}$ to $MC_{mn}$ arranged in a matrix with m rows (note that m is a positive integer) and n columns (note that n is a positive integer). The word lines $WL_1$ to $WL_m$ connects respective control gate electrodes of n memory cells arranged in the row direction. The bit lines $BL_1$ to $BL_n$ connects respective drain electrodes of m memory cells arranged in the column direction.

The sample cell region 12 includes m word line sample cells $SCW_{11}$ to $SCW_{m1}$ whose control gate electrodes are connected to the word lines $WL_1$ to $WL_m$, respectively, and n bit line sample cells $SCB_{11}$ to $SCB_{1n}$ whose drain electrodes are connected to the bit lines $BL_1$ to $BL_n$, respectively. The sample bit line $SBL_1$ connects respective drain electrodes of the word line sample cells $SCW_{11}$ to $SCW_{m1}$, and the sample word line $SWL_1$ connects respective control gate electrodes of the bit line sample cells $SCB_{11}$ to $SCB_{1n}$.

A single source line SL connects respective source electrodes of the memory cells $MC_{11}$ to $MC_{mn}$ in the memory cell region 11, and the source line SL also connects respective source electrodes of the sample cells in the sample cell region 12 (that is, the word line sample cells $SCW_{11}$ to $SCW_{m1}$ and the bit line sample cells $SCB_{11}$ to $SCB_{1n}$).

A dummy cell $SCD_{11}$ is formed in an area of the sample cell region 12 at which the sample word line $SWL_1$ intersects with the sample bit line $SBL_1$. The dummy cell $SCD_{11}$ is formally disposed to arrange the sample cells in matrix, and there is no need to dispose the dummy cell in stress monitoring in a burn-in process. Therefore, it may be eliminated.

The first embodiment is characterized in that the memory cells are each configured so that charges accumulated in the floating gate electrode thereof can move with difficulty and the sample cells are each configured so that charges accumulated in the floating gate electrode thereof can move with ease.

Hereinafter, the difference between the memory cells and the sample cells in the memory cell array 10 according to the first embodiment will be described with reference to the accompanying drawings.

Figure 3A:
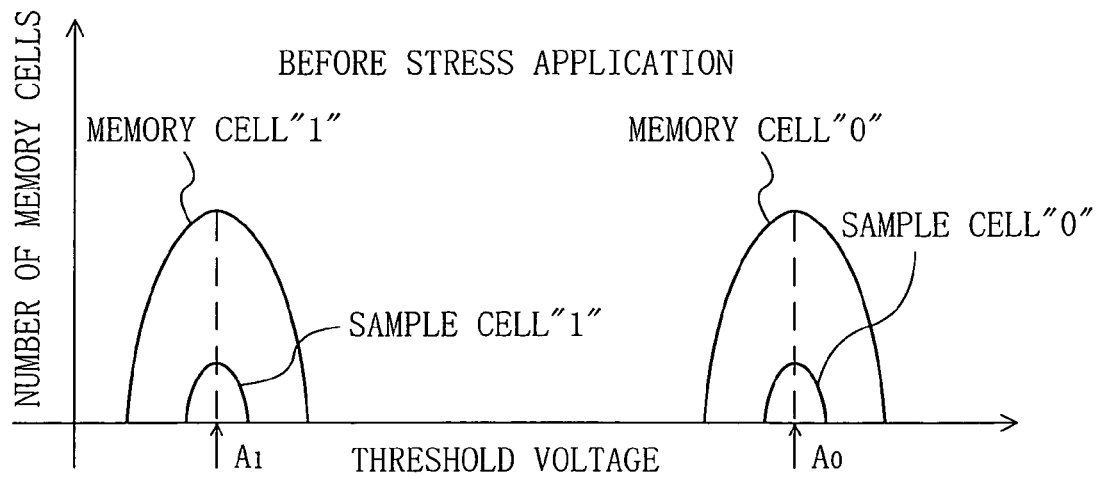
FIGS. 3A and 3B are graphs showing threshold voltage distributions of memory cells and sample cells of the semiconductor memory device according to the first embodiment of the present invention.
Figure 3B:
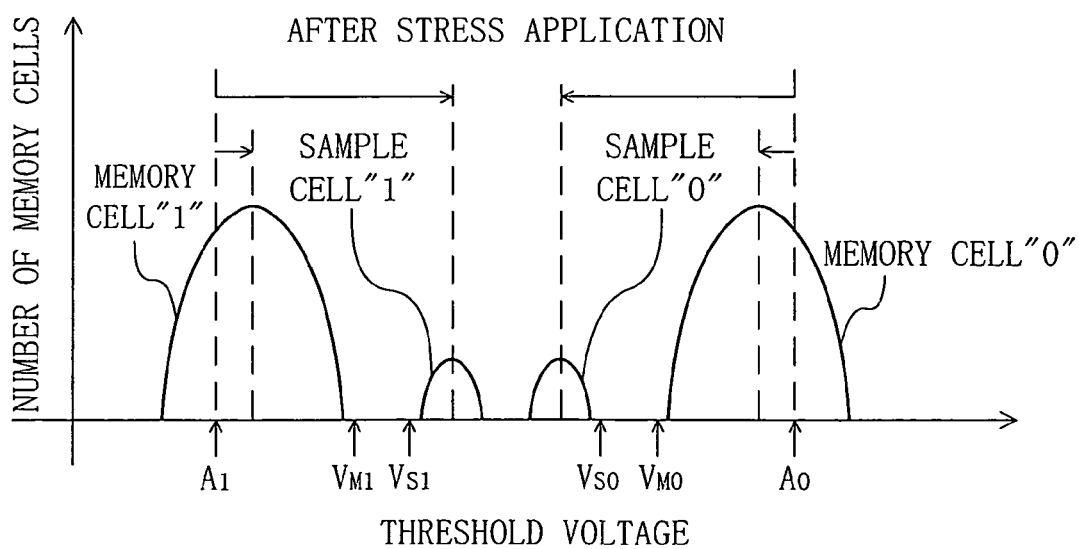

FIGS. 3A and 3B are graphs showing threshold voltage distributions of the memory cells and the sample cells of the semiconductor memory device according to the first embodiment. FIG. 3A shows the threshold voltage distributions before a stress is applied to the word lines and the bit lines, and FIG. 3B shows the threshold voltage distributions after a stress is applied to the word lines and the bit lines. FIGS. 3A and 3B plot the threshold voltages Vt of the memory cells and the sample cells in abscissa and the numbers of memory cells and sample cells in ordinate. Note that the abscissa and the ordinate of FIG. 3B have the same scales as those of FIG. 3A, respectively.

As shown in FIG. 3A, before stress application, the memory cells and the sample cells are divided, according to items of data written in the cells, into two states, i.e., the state in which the cell has a higher threshold voltage (a memory cell "0" and a sample cell "0"), and the state in which the cell has a lower threshold voltage (a memory cell "1" and a sample cell "1"). At this time, because of variation in characteristics of the memory cells and the sample cells, the threshold voltages are distributed to spread to a certain extent. Before the stress application, the memory cell "0" and the sample cell "0" have a substantially equal average threshold voltage, $M_0$, and the memory cell "1" and the sample cell "1" have a substantially equal average threshold voltage, $M_1$.

As shown in FIG. 3B, a voltage serving as a stress is applied by a burn-in apparatus, whereby charges retained in the floating gate electrodes of the memory cells and the sample cells transfer to change the threshold voltages of the cells. Note that the horizontal arrows in FIG. 3B indicate the amounts of changes in the threshold voltages of the memory cells and the sample cells, which are caused by the stress application. The memory cells are each configured so that charges accumulated in the floating gate electrode thereof can move with difficulty, while the sample cells are each configured so that charges accumulated in the floating gate electrode thereof can move with ease. Because of these configurations, when a stress is applied, the threshold voltage of the memory cell "1" slightly rises, while the threshold voltage of the sample cell "1" sharply rises. Likewise, the threshold voltage of the memory cell "0" slightly falls, while the threshold voltage of the sample cell "0" sharply falls.

In the disturb test conducted on the semiconductor memory device in the first embodiment, the amount of change in threshold voltage of the sample cell is measured to determine whether or not a stress as predetermined has been applied.

To be more specific, after the burin-in process, the threshold voltage of each sample cell is measured with a tester. If the sample cell retaining data "1" has a threshold voltage higher than $V_{S1}$ and the sample cell retaining data "0" has a threshold voltage higher than $V_{S0}$, the burn-in process is judged to have applied a normal stress.

If it is judged to have failed to apply a normal stress, the voltage to be supplied from the burn-in apparatus is adjusted and a stress is applied again. On the other hand, if it is judged to have applied a normal stress, the threshold voltages of the memory cells are measured with a tester or the like. If the memory cell retaining data "1" has a threshold voltage lower than $V_{M1}$ and the memory cell retaining data "0" has a threshold voltage higher than $V_{M0}$, the memory cell array is judged to have no disturb failure.

As described above, the semiconductor memory device of the first embodiment is defined so that the amount of change in the threshold voltage of the sample cell is greater than that of the memory cell. Therefore, the amount of change in the threshold voltage of the sample cell is measured after the burn-in process, which enables determination of whether or not a normal stress has been applied. Accordingly, in the case where a normal stress as predetermined has been applied, the amount of change in the threshold voltage of the memory cell after the burn-in process can be measured to carry out a reliable check of the memory cell array for disturb failure.

In the first embodiment, description has been made of the device which employs the stacked type EEPROM cell as the memory cell and the sample cell. However, the memory cell and the sample cell are not limited to the stacked type EEPROM cell. Even if use is made of a split type EEPROM cell in which the control gate electrode is provided beside the floating gate electrode, or a FeRAM cell composed of a ferroelectric capacitor for accumulating charges and a transistor for reading data, the first embodiment is also applicable.

In the first embodiment, the sample cell region is not necessarily formed with both the word line sample cells and the bit line sample cells. In some structures of the memory cell array or some methods for driving a memory cell array, the stress applied to the word line or the bit line may have little impact on the reliability of the semiconductor memory device. In such a semiconductor memory device, a stress does not have to be applied to one of the word line and the bit line in the disturb test. Therefore, either of the word line sample cells and the bit line sample cells may be eliminated.

Hereinafter, with reference to the accompanying drawings, description will be made of concrete structures of the memory cell and sample cell capable of realizing the difference in change properties of the threshold voltage between the two cells, which is described above, in the semiconductor memory device of the first embodiment.

(Concrete Example of Memory Cell and Sample Cell)

Figure 4A:
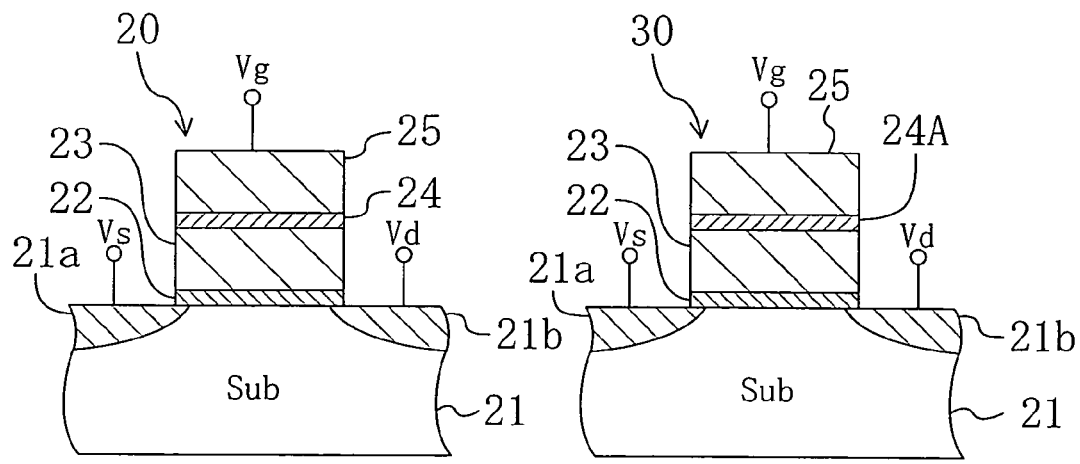
FIG. 4A is a sectional view showing the memory cell and the sample cell of the semiconductor memory device according to the first embodiment of the present invention.

FIG. 4A shows the cross-sectional structures of the memory cell and the sample cell of the semiconductor memory device according to the first embodiment, which are taken along the direction in which the bit line extends. Referring to FIG. 4A, a memory cell 20 is composed of a doped source region 21a, a doped drain region 21b, a tunnel insulating film 22, a floating gate electrode 23, an ONO film 24, and a control gate electrode 25. In a semiconductor substrate 21 made of, for example, silicon, the doped source region 21a and the doped drain region 21b are formed by dopant diffusion into an active area defined by a field insulating film. The tunnel insulating film 22 made of silicon oxide is formed on the semiconductor substrate 21. The floating gate electrode 23 is made of polysilicon. The ONO film 24 serving as a capacitor insulating film is formed by sequentially stacking a first silicon oxide film, a silicon nitride film, and a second silicon oxide film. The control gate electrode 25 is made of polysilicon.

The control gate electrode 25 is shared, as a word line, among memory cells arranged in the row direction. The doped source region 21a is connected to a source line and used as a source electrode. The doped drain region 21b is connected to a bit line and used as a drain electrode. A gate voltage Vg is applied to the control gate electrode 25, and a source voltage Vs and a drain voltage Vd are applied to the doped source region 21a and the doped drain region 21b, respectively.

The sample cell 30 is provided with a silicon oxide film (an OO film) 24A as a capacitor insulating film. The silicon oxide film 24A is formed between the floating gate electrode 23 and the control gate electrode 25 by sequentially stacking a first silicon oxide film and a second silicon oxide film. Other elements of the sample cell 30 except for the capacitor insulating film are identical to those of the memory cell 20, so that description thereof is omitted.

This sample cell 30 is attained in the following method. In a memory cell fabrication region and a sample cell fabrication region, first, all processes up to the process step of a capacitor insulating film formation process in which a first silicon oxide film and a silicon nitride film are sequentially stacked are concurrently performed. Subsequently, using a mask covering the memory cell fabrication region and exposing the sample cell fabrication region, a portion of the silicon nitride film in the sample cell fabrication region is selectively removed. A second silicon oxide film is then deposited, whereby a stacked film made by sequentially stacking the first silicon oxide film, the silicon nitride film, and the second silicon oxide film is formed in the memory cell fabrication region, and a stacked film made by sequentially stacking the first silicon oxide film and the second silicon oxide film is formed in the sample cell fabrication region. Next, a polysilicon film serving as the control gate electrode is deposited, and the film is patterned into a predetermined shape. As a result, the ONO film 24 is formed in the memory cell, while the silicon oxide film 24A as the stacked film made by stacking the first silicon oxide film and the second silicon oxide film is formed in the sample cell 30.

Figure 4B:
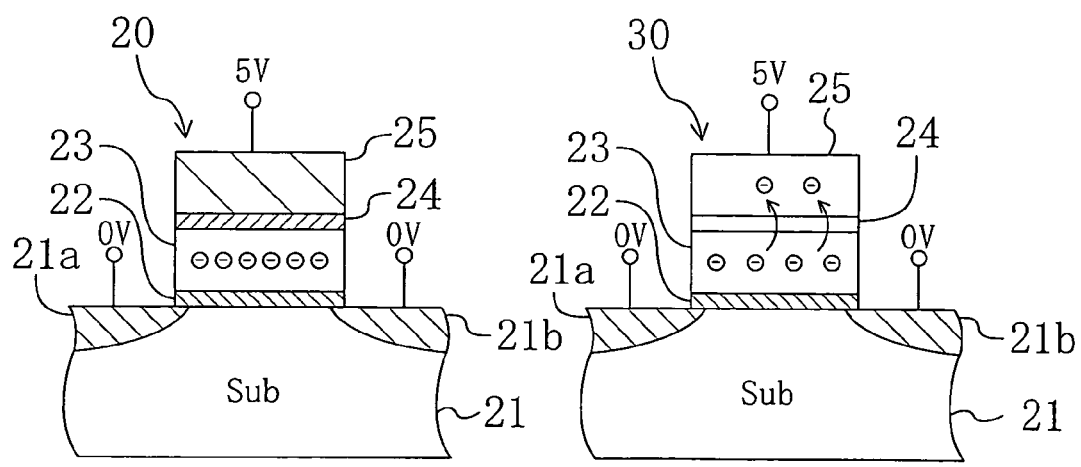
FIG. 4B is a sectional view schematically showing the behavior of charges when a stress is applied to the memory cell and the sample cell shown in FIG. 4A.

FIG. 4B schematically shows how charges transfer when a stress is applied to the memory cell 20 and the sample cell 30 shown in FIG. 4A.

As shown FIG. 4B, a voltage of about 5 V as a stress is applied to the gate electrode, and source and drain voltages are set at 0 V. Since the ONO film 24 of high insulation property is used in the memory cell 20, charge transfer through the capacitor insulating film hardly occurs. In contrary to this, since the silicon oxide film 24A having a lower insulation property than the ONO film 24 is used in the sample cell 30, charges transfer through the capacitor insulating film to the control gate electrode 25.

As described above, the ONO film 24 is used for the capacitor insulating film of the memory cell 20 and the silicon oxide film 24A having a lower resistivity than the ONO film 24 is used for the capacitor insulating film of the sample cell 30. This enables fabrication of the memory cell 20 and the sample cell 30 such that in applying a stress in the disturb test, the amount of change in charges in the sample cell 30 is larger than that in the memory cell 20.

In the first embodiment, description has been made of the silicon oxide film 24A as the stacked film made by sequentially stacking the first silicon oxide film and the second oxide film, both of which also constitute the ONO film 24. However, it is sufficient that the silicon oxide film 24A is formed to have a lower resistivity than the ONO film. The silicon oxide film 24A may be a single layer film made of the first silicon oxide film or the second silicon oxide film.

(First Modification of First Embodiment)

A semiconductor memory device according to a first modification of the first embodiment will be described below with reference to the accompanying drawings.

The semiconductor memory device according to the first modification of the first embodiment differs from the first embodiment shown in FIG. 4A in the cross-sectional structure of the sample cell. The block configuration of the semiconductor memory device and the circuit configuration of the memory cell array in the first modification of the first embodiment are identical to those shown in FIGS. 1 and 2. Therefore, description thereof is omitted.

Figure 5A:
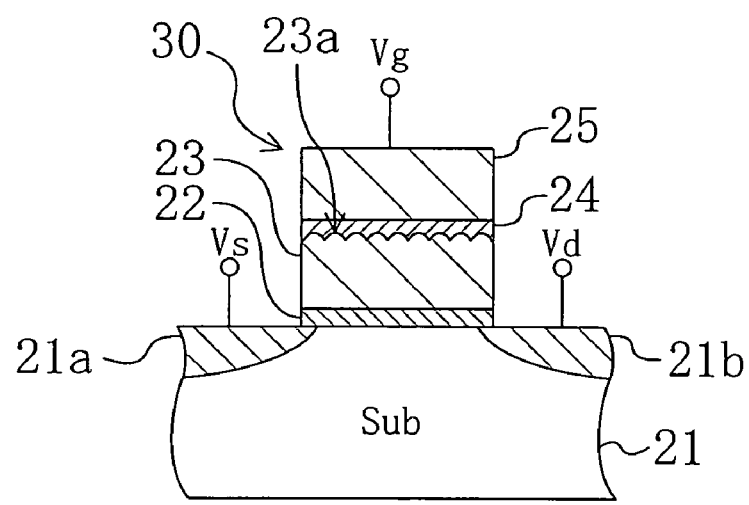
FIG. 5A is a sectional view showing a sample cell of a semiconductor memory device according to a first modification of the first embodiment of the present invention.

FIG. 5A shows the cross-sectional structure of the sample cell 30 of the semiconductor memory device according to the first modification of the first embodiment. Since the structure of the memory cell is identical to that of the memory cell 20 shown in FIG. 4A, illustration and description thereof are omitted. As shown in FIG. 5A, the sample cell 30 in the first modification differs from the memory cell 20 in that projections (spikes) 23a are provided in the upper portion of the floating gate electrode 23.

This sample cell 30 is attained in the following method. In a memory cell fabrication region and a sample cell fabrication region, all processes up to the process in which a first polysilicon film for forming the floating gate electrode is deposited are concurrently performed. In this film formation, the first polysilicon film is formed by film deposition on the smooth semiconductor substrate 21 with the tunnel insulating film 22 interposed therebetween. Therefore, the deposited film has a smooth upper surface. Subsequently, using a mask covering the memory cell fabrication region and exposing the sample cell fabrication region, the upper portion of the first polysilicon film in the sample cell formation region is formed with the projections in such a manner, for example, that a pressing member or the like with a surface of projections and depressions presses the portion of the first polysilicon film exposed in the sample cell formation region. Next, the ONO film 24 and a second polysilicon film serving as the control gate electrode 25 are sequentially deposited, and the films are patterned into a predetermined shape. Thus, the floating gate electrode 23 of the memory cell 20 is formed to have a smooth upper portion, while the floating gate electrode 23 of the sample cell 30 is formed to have an upper portion with the projections 23a.

Figure 5B:
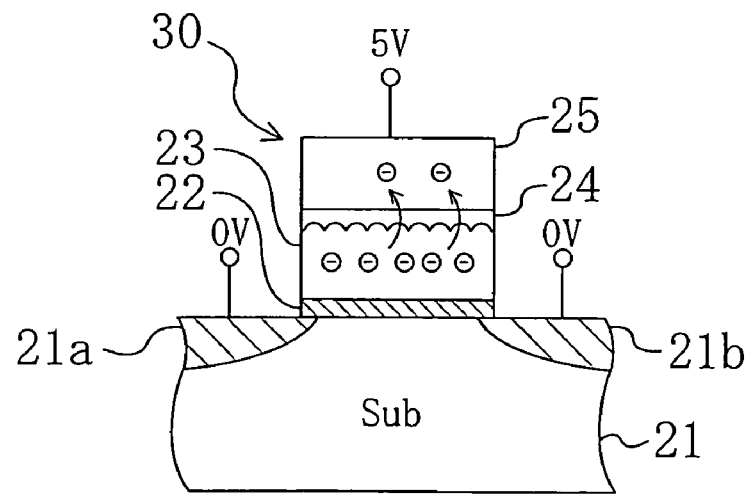
FIG. 5B is a sectional view schematically showing the behavior of charges when a stress is applied to the sample cell shown in FIG. 5A.

FIG. 5B is a sectional view for explaining charge transfer in the sample cell in the first modification. As shown in FIG. 5B, when a voltage of 5 V is applied to the gate electrode of the sample cell 30, an electric field is concentrated at the projections 23a of the floating gate electrode 23. Therefore, charges accumulated in the floating gate electrode 23 transfer from the projections 23a through the ONO film 24 to the control gate electrode 25.

As described above, the floating gate electrode 23 of the memory cell 20 is formed to have a smooth upper portion, while the floating gate electrode 23 of the sample cell 30 is provided at its upper portion with the projections 23a to have an upper surface with projections and depressions. This enables fabrication of the memory cell 20 and the sample cell 30 such that in applying a stress in the disturb test, the amount of change in charges in the sample cell 30 is larger than that in the memory cell 20.

(Second Modification of First Embodiment)

A semiconductor memory device according to a second modification of the first embodiment will be described below with reference to the accompanying drawings.

The semiconductor memory device according to the second modification of the first embodiment differs from that of the first embodiment shown in FIG. 4A in the cross-sectional structure of the sample cell. The block configuration of the semiconductor memory device and the circuit configuration of the memory cell array in the second modification of the first embodiment are identical to those shown in FIGS. 1 and 2. Therefore, description thereof is omitted.

Figure 6A:
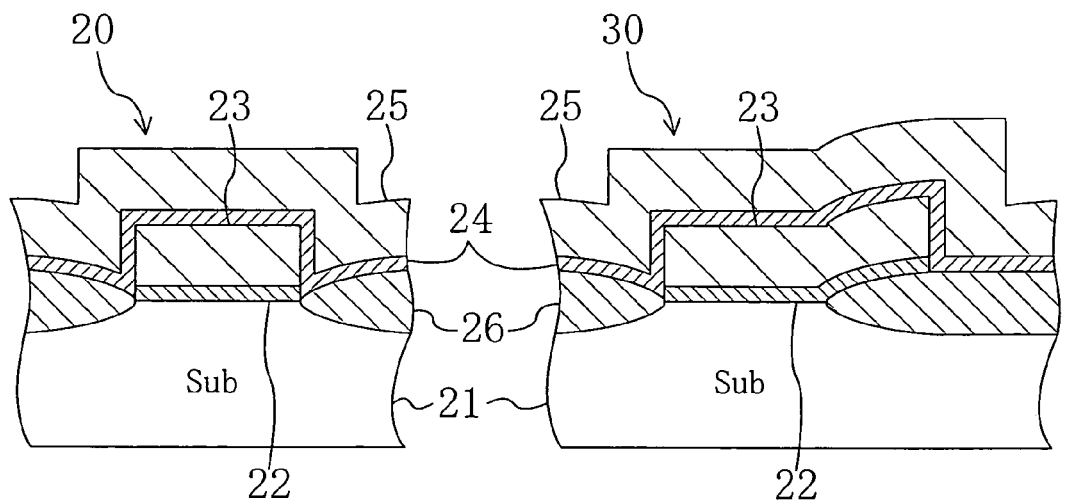
FIG. 6A is a sectional view showing a memory cell and a sample cell of a semiconductor memory device according to a second modification of the first embodiment of the present invention.
Figure 6B:
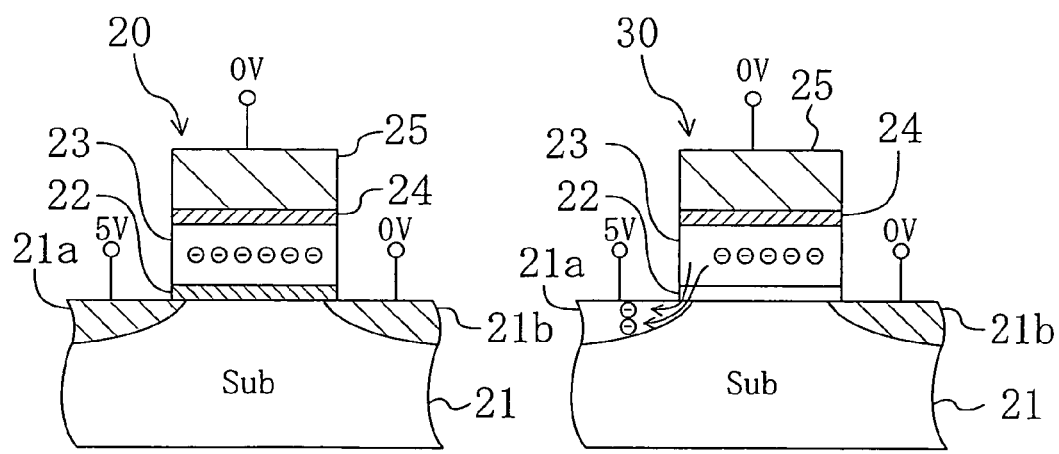
FIG. 6B is a sectional view schematically showing the behavior of charges when a stress is applied to the memory cell and the sample cell shown in FIG. 6A.

FIGS. 6A and 6B are sectional views explaining the sample cell in the second modification. FIG. 6A illustrates the cross-sectional structures of the memory cell 20 and the sample cell 30 taken along the direction in which the control gate electrode extends. FIG. 6B illustrates the cross-sectional structures taken perpendicularly to the direction in which the control gate electrode extends.

As shown in FIG. 6A, in the second modification, the memory cell 20 differs from the sample cell 30 in length of the floating gate electrode 23 when viewed in the word line direction. The memory cell 20 is formed to have a length of the floating gate electrode 23 substantially equal to the length of the tunnel insulating film 22, while the sample cell 30 is formed to have a long floating gate electrode 23 extending along the word line direction from an area with the tunnel insulating film 22 formed therein to above a field insulating film 26.

That is to say, in the memory cell 20, the area in which the floating gate electrode 23 and the semiconductor substrate 21 face each other is substantially identical to the area in which the floating gate electrode 23 and the control gate electrode 25 face each other. In contrast to this, in the sample cell 30, the area in which the floating gate electrode 23 and the semiconductor substrate 21 face each other is made smaller than the area in which the floating gate electrode 23 and the control gate electrode 25 face each other.

This sample cell 30 is attained in the following method. In the process step of forming the tunnel insulating film 22 and the field insulating film to form an active area and an insulation area, a mask pattern is used which has openings of the same dimension provided on the memory cell fabrication region and on the sample cell fabrication region. In the step of forming the floating gate electrode 23, a mask pattern is used which has openings of different dimensions such that the opening in the memory cell fabrication region is provided on the active area thereof and that the opening in the sample cell fabrication region is provided on a region ranging from the active area to above the insulation area thereof. Thus, the floating gate electrode 23 of the sample cell 30 is formed to extend to above the field insulating film 26.

As is apparent from the above, there is no need to use a specific mask for forming the sample cell 30 in the second modification. Therefore, the number of process steps does not increase as compared to the case of forming only the memory cell 20.

FIG. 6B illustrates the behavior of charges during operation in the memory cell 20 and the sample cell 30 thus constructed according to the second modification, and it is shown as a sectional view taken along the direction in which the bit line extends.

As shown FIG. 6B, charges in the memory cell 20 in the second modification hardly transfer like the first embodiment. In contrary to this, charges in the sample cell 30 in the second modification transfer from the floating gate electrode 23 through the tunnel insulating film 22 to the source electrode. This results from the fact that the capacitive coupling ratio of the sample cell 30 is made larger than that of the memory cell 20. That is to say, in terms of the area in which the floating gate electrode 23 and the control gate electrode 25 face each other with the capacitor insulating film interposed therebetween, the sample cell 30 is made larger than the memory cell 20. This enables fabrication of the memory cell 20 and the sample cell 30 such that in applying a stress in the disturb test, the amount of change in charges in the sample cell 30 is larger than that in the memory cell 20.

(Third Modification of First Embodiment)

A semiconductor memory device according to a third modification of the first embodiment will be described below with reference to the accompanying drawings.

The semiconductor memory device according to the third modification of the first embodiment differs from that of the first embodiment in that in the memory cell array 10, the sample cell region 12 is disposed between the memory cell regions 11.

Figure 7:
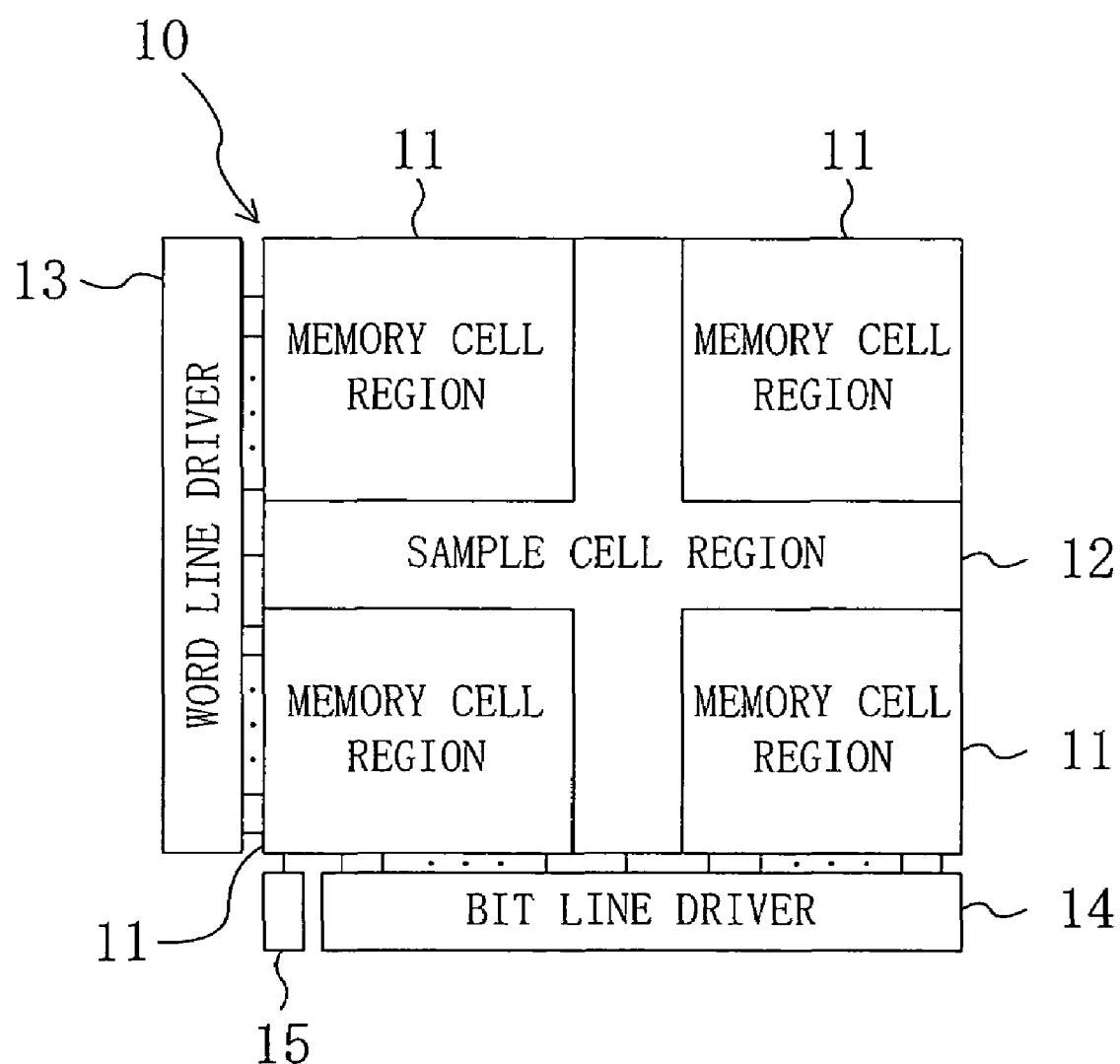
FIG. 7 is a block diagram showing a semiconductor memory device according to a third modification of the first embodiment of the present invention.

FIG. 7 is a block diagram showing the semiconductor memory device according to the third modification of the first embodiment. Referring to FIG. 7, four memory cell regions 11 are formed in the shape of four divided blocks. The sample cell region 12 is formed between the memory cell regions. Specifically, in the memory cell array 10 shown in FIGS. 1 and 2, the sample cells are connected to the memory cells of the memory cell matrix with m rows and n columns which are arranged on an mth row and an nth column. On the other hand, in the memory cell array 10 shown in FIG. 7, the bit line sample cells $SCB_{11}$ to $SCB_{1n}$ are arranged between an ith row and an (i+1)th row (i<m), and the word line sample cells $SCW_{11}$ to $SCW_{m1}$ are arranged between a jth column and a (j+1)th column (j<n).

As described above, in the memory cell array 10, the positions of the sample cells are not limited to an edge of an array of the word lines $WL_1$ to $WL_m$ and an edge of an array of the bit lines $BL_1$ to $BL_n$. Alternatively, the sample cells may be provided between the memory cell regions.

However, in order to conduct a more precise disturb test, the word line sample cells $SCW_{11}$ to $SCW_{m1}$ are preferably provided on the side of the memory cell array 10 opposite to the word line driver 13, and the bit line sample cells $SCB_{11}$ to $SCB_{1n}$ are preferably provided on the side of the memory cell array 10 opposite to the bit line driver 14. By arranging the sample cells a farther distance away from the drivers serving as voltage supply sources, the sample cells thus arranged can check whether or not a stress as defined has been applied to all the memory cells in consideration of the influence of a voltage drop caused by the resistances of the word lines and the bit lines.

(Second Embodiment)

A semiconductor memory device according to a second embodiment of the present invention will be described below with reference to the accompanying drawings.

The block configuration of the semiconductor memory device according to the second embodiment is similar to that shown in FIG. 1. The second embodiment differs from the first embodiment in that switch means for separating an electrical connection between the memory cell region 11 and the sample cell region 12 is provided.

Figure 8:
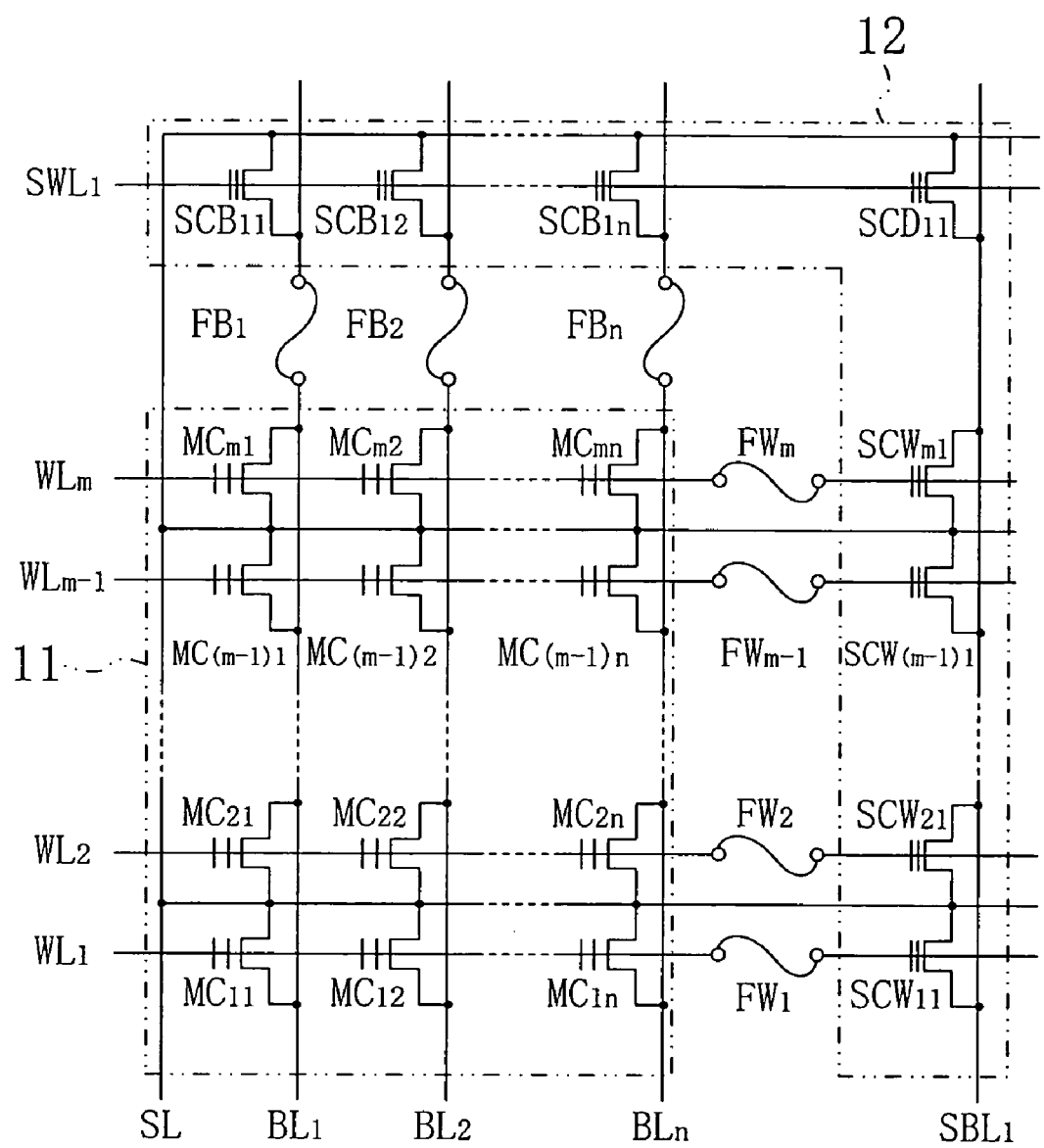
FIG. 8 is a circuit diagram showing a memory cell array of a semiconductor memory device according to a second embodiment of the present invention.

FIG. 8 shows the circuit configuration of the memory cell array of the semiconductor memory device according to the second embodiment. Referring to FIG. 8, the memory cell array 10 is provided with, as switch means for controlling the connection between the memory cell region 11 and the sample cell region 12, fuses $FW_1$ to $FW_m$ for connecting the control gate electrodes of the word line sample cells $SCW_{11}$ to $SCW_{m1}$ to the control gate electrodes of the memory cells $MC_{1n}$ to $MC_{mn}$, respectively. Moreover, the memory cell array 10 is provided with fuses $FB_1$ to $FB_n$ for connecting the drain electrodes of the bit line sample cells $SCB_{11}$ to $SCB_{1n}$ to the drain electrodes of the memory cells $MC_{m1}$ to $MC_{mn}$, respectively.

In this configuration, after the disturb test is completed, the fuses $FW_1$ to $FW_m$ and $FB_1$ to $FB_n$ are made blown either with a laser trimmer or the like, or with a large current application to the word lines and the bit lines in the memory cell array.

The sample cells are fabricated to have a degraded disturb characteristics, which results in poor reliabilities of reading and writing operations of the sample cell. For example, the breakdown resistance of the tunnel insulating film of the sample cell is degraded more readily than that of the memory cell.

However, the semiconductor memory device of the first embodiment is not provided with means for separating the sample cell region 12 from the word lines $WL_1$ to $WL_m$ and the bit lines $BL_1$ to $BL_n$. Therefore, during a normal operation such as data reading from and data writing in the memory cells $MC_{1n}$ to $MC_{mn}$, a disadvantage might happen. For example, the control gate electrode of the sample cell may be short-circuited to the source electrode or the drain electrode thereof, and thus the potential of the word line cannot be controlled.

On the other hand, in the semiconductor memory device of the second embodiment, after the disturb test is completed, the fuses $FW_1$ to $FW_m$ and $FB_1$ to $FB_n$ can be made blown to separate the sample cell region 12 from the word lines $WL_1$ to $WL_m$ and the bit lines $BL_1$ to $BL_n$. This prevents the disadvantage caused by the sample cell during a normal operation and improves the reliability of the device.

(Modification of Second Embodiment)

A semiconductor memory device according to one modification of the second embodiment of the present invention will be described below with reference to the accompanying drawings.

Figure 9:
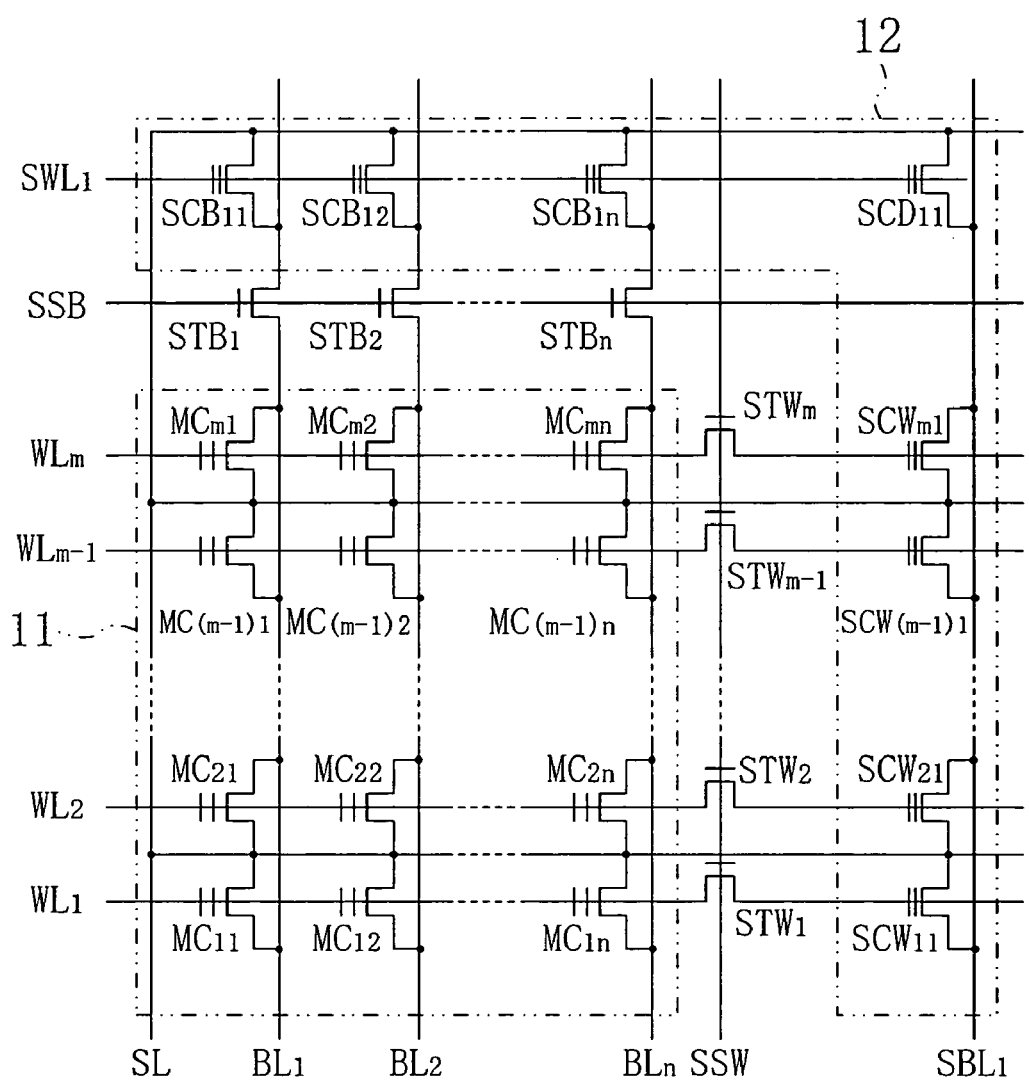
FIG. 9 is a circuit diagram showing a memory cell array of a semiconductor memory device according to one modification of the second embodiment of the present invention.

FIG. 9 shows the circuit configuration of a memory cell array of the semiconductor memory device according to one modification of the second embodiment.

Referring to FIG. 9, the memory cell array 10 is provided with, as switch means for separating an electrical connection between the memory cell region 11 and the sample cell region 12, switch transistors $STW_1$ to $STW_m$ for connecting the control gate electrodes of the word line sample cells $SCW_{11}$ to $SCW_{m1}$ to the control gate electrodes of the memory cells $MC_{1n}$ to $MC_{mn}$, respectively. Moreover, the memory cell array 10 is provided with switch transistors $STB_1$ to $STB_n$ for connecting the drain electrodes of the bit line sample cells $SCB_{11}$ to $SCB_{1n}$ to the drain electrodes of the memory cells $MC_{m1}$ to $MC_{mn}$, respectively.

A control signal SSW is connected to gate electrodes of the switch transistors $STW_1$ to $STW_m$ and a control signal SSB is connected to gate electrodes of the switch transistors $STB_1$ to $STB_n$. In the burn-in process, the control signals SSW and SSB turn on the switch transistors $STW_1$ to $STW_m$ and $STB_1$ to $STB_n$, respectively.

The switch transistors $STW_1$ to $STW_m$ and $STB_1$ to $STB_n$ are controlled using, as the control signals SSW and SSB, sufficiently higher voltages than the voltages applied to the word lines and the bit lines in the burn-in process. This sufficiently reduces the resistances of the switch transistors $STW_1$ to $STW_m$ and $STB_1$ to $STB_n$, so that the voltage applied to the bit lines and the word lines is also applied, with no voltage drop, to the corresponding sample cells. As a result, whether or not a normal stress has applied can be detected reliably.

Moreover, in the semiconductor memory device according to this modification of the second embodiment, a specified area of the memory cell region 11 retains information that which of "H" and "L" levels the control signals SSW and SSB have.

To be more specific, if the specified memory cell of the memory cell region 11 has data "1", the control signals SSW and SSB have "H" level. If the specified memory cell of the memory cell region 11 has data "0", the control signals SSW and SSB have "L" level.

With such storage, the switch transistors are controlled as follows. Before the burn-in process, data "1" is retained in the specified memory cell of the memory cell region 11, whereby the control signals SSW and SSB having "H" level turn on the switch transistors $STW_1$ to $STW_m$ and $STB_1$ to $STB_n$. After the disturb test is completed, data "0" is retained in the specified memory cell, whereby the control signals SSW and SSB having "L" level turn off the switch transistors $STW_1$ to $STW_m$ and $STB_1$ to $STB_n$. This reliably inactivates the sample cell region after the disturb test is completed.

With this modification of the second embodiment, the sample cell region can be separated from the memory cell region at a lower cost than the technique in which this separation is performed by making fuses blown.

(Third Embodiment)

A semiconductor memory device according to a third embodiment of the present invention will be described below with reference to the accompanying drawings.

Figure 10:
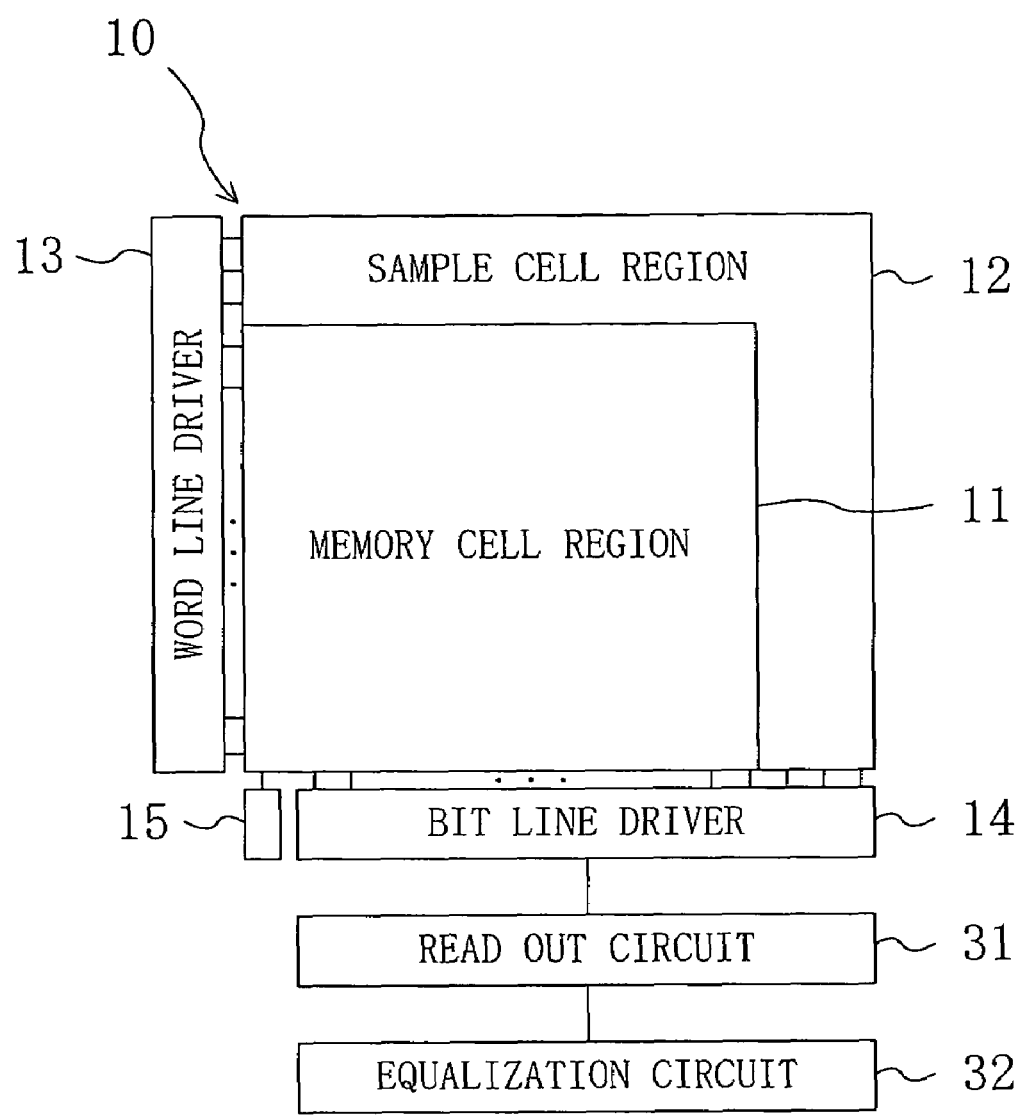
FIG. 10 is a block diagram showing a semiconductor memory device according to a third embodiment of the present invention.

FIG. 10 shows the block configuration of the semiconductor memory device according to the third embodiment.

Referring to FIG. 10, the bit line driver 14 is provided with an equalization circuit 32 via a read out circuit 31. The read out circuit 31 is a control circuit for performing reading operation as shown in the first embodiment.

The semiconductor memory device of the third embodiment is characterized in that in the sample cell region 12 of the memory cell array 10, a plurality of sample cells are provided on one bit line or on one word line, and that the amounts of changes in the threshold voltages of the plurality of sample cells are equalized to read the resulting value out.

Figure 11:
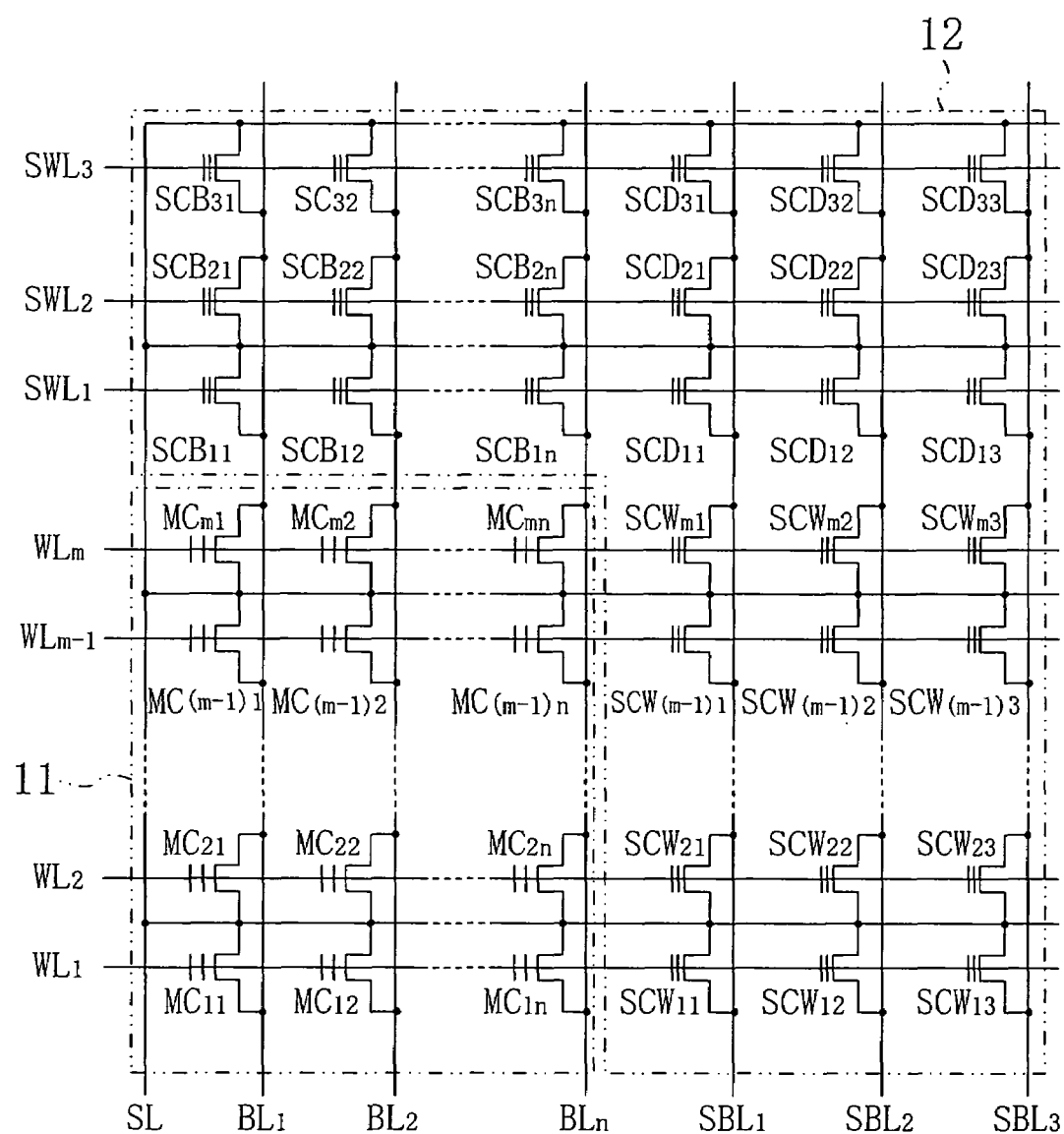
FIG. 11 is a circuit diagram showing a memory cell array of the semiconductor memory device according to the third embodiment of the present invention.

FIG. 11 is a circuit diagram showing a memory cell array of the semiconductor memory device according to the third embodiment. Referring to FIG. 11, as the sample cells for monitoring stresses applied to the word lines $WL_1$ to $WL_m$, three word line sample cells $SCW_{11}$ to $SCW_{m1}$, $SCW_{12}$ to $SCW_{m2}$, and $SCW_{13}$ to $SCW_{m3}$ connected in serial are provided on the word lines $WL_1$ to $WL_m$, respectively. Moreover, as the sample cells for monitoring stresses applied to the bit lines $BL_1$ to $BL_n$, three bit line sample cells $SCB_{11}$ to $SCB_{1n}$, $SCB_{21}$ to $SCB_{2n}$, and $SCB_{31}$ to $SCB_{3n}$ connected in serial are provided on the bit lines $BL_1$ to $BL_n$, respectively.

The sample bit line $SBL_1$ connects respective drain electrodes of the word line sample cells $SCW_{11}$ to $SCW_{m1}$, the sample bit line $SBL_2$ connects respective drain electrodes of the word line sample cells $SCW_{12}$ to $SCW_{m2}$, and the sample bit line $SBL_3$ connects respective drain electrodes of the word line sample cells $SCW_{13}$ to $SCW_{m3}$. Likewise, the sample word line $SWL_1$ connects respective control gate electrodes of the bit line sample cells $SCB_{11}$ to $SCB_{1n}$, the sample word line $SWL_2$ connects respective control gate electrodes of the bit line sample cells $SCB_{21}$ to $SCB_{2n}$, and the sample word line $SWL_3$ connects respective control gate electrodes of the bit line sample cells $SCB_{31}$ to $SCB_{3n}$.

In the sample cell region 12 in the third embodiment, dummy cells $SCD_{11}$ to $SCD_{33}$ are formed in areas at which the sample word lines intersect with the sample bit lines. These dummy cells $SCD_{11}$ to $SCD_{33}$ are formally disposed to arrange the sample cells in matrix, so that it may be eliminated.

In conducting the disturb test on the semiconductor memory device of the third embodiment, a stress applied to each of the bit lines during the burn-in process is applied also to the three bit line sample cells.

The stress applied to the bit lines $BL_1$ is measured in the following manner. The read out circuit 31 performs a reading operation on the three bit line sample cells $SCB_{11}$, $SCB_{21}$, and $SCB_{31}$ with the control gate voltages thereof set at $V_{S1}$ level or $V_{S0}$ level. If the threshold voltage is $V_{S1}$ or lower or $V_{S0}$ or higher, a pass signal is supplied to the equalization circuit 32. If the threshold voltage is higher than $V_{S1}$ or lower than $V_{S0}$, a failure signal is supplied to the equalization circuit 32. The equalization circuit 32 supplies, as a judge result, either of the pass signal and the failure signal, whichever is more frequently received from the read out circuit 31.

Thus, the plurality of sample cells for one bit line and one word line are used to determine whether a stress application has been normally performed or not. Therefore, even though the characteristics of the sample cells vary, whether a normal stress has been applied or not can be determined with influences of this variation reduced.

In the third embodiment, the number of the sample cells connected to one bit line or one word line is not limited to three. It is sufficient that two or more sample cells are connected thereto.

In the third embodiment, the positions of the sample cells are not limited to the periphery of the memory cell region, and alternatively the sample cells may be positioned between the memory cells.

In the third embodiment, as switch means for controlling a connection between the memory cell region 11 and the sample cell region 12, a fuse shown in FIG. 8 or a switch transistor shown in FIG. 9 may be provided.

(Fourth Embodiment)

A semiconductor memory device according to a fourth embodiment of the present invention will be described below with reference to the accompanying drawings.

The semiconductor memory device of the fourth embodiment differs from that of the first embodiment in that in the sample cell region, the bit lines and the word lines are each provided with a plurality of independently controllable sample cells. The structures of other members are similar to those shown in FIG. 1. Therefore, illustration and description thereof are omitted.

Figure 12:
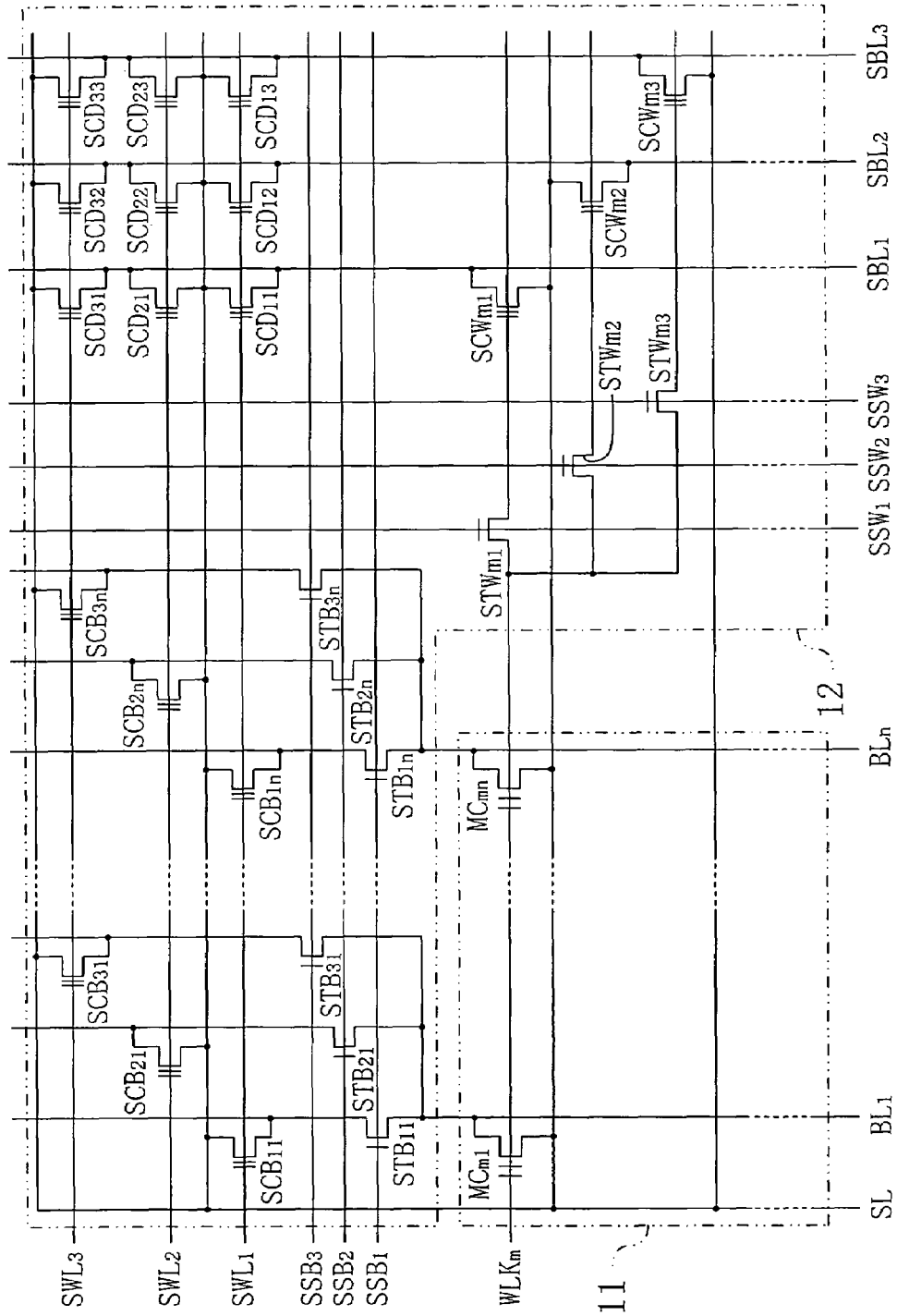
FIG. 12 is a circuit diagram showing a memory cell array of a semiconductor memory device according to a fourth embodiment of the present invention.

FIG. 12 is a circuit diagram showing the memory cell array of the semiconductor memory device according to the fourth embodiment. Referring to FIG. 12, as the sample cells for monitoring stresses applied to the word lines $WL_1$ to $WL_m$, three word line sample cells $SCW_{11}$ to $SCW_{m1}$, $SCW_{12}$ to $SCW_{12}$, and $SCW_{13}$ to $SCW_{m3}$ are provided which are connected in parallel through switch transistors $STW_{11}$ to $STW_{m1}$, $STW_{12}$ to $STW_{m2}$, and $STW_{13}$ to $STW_{m3}$, respectively. Moreover, as the sample cells for monitoring stresses applied to the bit lines $BL_1$ to $BL_n$, three bit line sample cells $SCB_{11}$ to $SCB_{1n}$, $SCB_{21}$ to $SCB_{2n}$, and $SCB_{31}$ to $SCB_{3n}$ are provided which are connected in parallel through switch transistors $STB_{11}$ to $STB_{1n}$, $STB_{21}$ to $STB_{2n}$, and $STB_{31}$ to $STB_{3n}$, respectively.

The sample bit line $SBL_1$ connects respective drain electrodes of the word line sample cells $SCW_{11}$ to $SCW_{m1}$, the sample bit line $SBL_2$ connects respective drain electrodes of the word line sample cells $SCW_{12}$ to $SCW_{m2}$, and the sample bit line $SBL_3$ connects respective drain electrodes of the word line sample cells $SCW_{13}$ to $SCW_{m3}$. Likewise, the sample word line $SWL_1$ connects respective control gate electrodes of the bit line sample cells $SCB_{11}$ to $SCB_{1n}$, the sample word line $SWL_2$ connects respective control gate electrodes of the bit line sample cells $SCB_{21}$ to $SCB_{2n}$, and the sample word line $SWL_3$ connects respective control gate electrodes of the bit line sample cells $SCB_{31}$ to $SCB_{3n}$.

Control signals $SSW_1$, $SSW_2$, and $SSW_3$ connect gate electrodes of the switch transistors $STW_{11}$ to $STW_{m1}$, $STW_{12}$ to $STW_{m2}$, and $STW_{13}$ to $STW_{m3}$, respectively. Likewise, control signals $SSB_1$, $SSB_2$, and $SSB_3$ connects gate electrodes of the switch transistors $STB_{11}$, to $STB_{1n}$, $STB_{21}$ to $STB_{2n}$, and $STB_{31}$ to $STB_{3n}$, respectively.

In the sample cell region 12 in the fourth embodiment, dummy cells $SCD_{11}$ to $SCD_{33}$ are formed in areas at which the sample word lines intersect with the sample bit lines. These dummy cells $SCD_{11}$ to $SCD_{33}$ are formally disposed to arrange the sample cells in matrix, so that it may be eliminated.

On the semiconductor memory device according to the fourth embodiment, the disturb test is performed in the following manner. If a stress is applied, for example, to the bit lines $BL_1$ to $BL_n$, the control signal $SSB_1$, $SSB_2$, and $SSB_3$ independently control the three switch transistors $STB_{11}$ to $STB_{1n}$, $STB_{21}$ to $STB_{2n}$, and $STB_{31}$ to $STB_{3n}$, respectively. By this control, one cell can be selected from the three bit line sample cells $SCB_{11}$ to $SCB_{1n}$, $SCB_{21}$ to $SCB_{2n}$, and $SCB_{31}$ to $SCB_{3n}$ to apply a stress to the selected cell.

Therefore, the stress application times for, for example, the respective bit lines $BL_1$ to $BL_n$ are changed, which enables independent controls of the stress application times for the bit line sample cells $SCB_{11}$ to $SCB_{1n}$, for the bit line sample cells $SCB_{21}$ to $SCB_{2n}$, and for the bit line sample cells $SCB_{31}$ to $SCB_{3n}$.

As described above, with the semiconductor memory device of the fourth embodiment, in the case of conducting the disturb test with the stress application time changed, there is no need to repeatedly perform the burn-in process with the burn-in apparatus and the measurement process of the threshold voltage of the sample cell with a tester or the like. Moreover, the disturb test can be conducted with ease and reliability while the stress condition is defined in detail.

(Fifth Embodiment)

A semiconductor memory device according to a fifth embodiment of the present invention will be described below with reference to the accompanying drawings.

Figure 13:
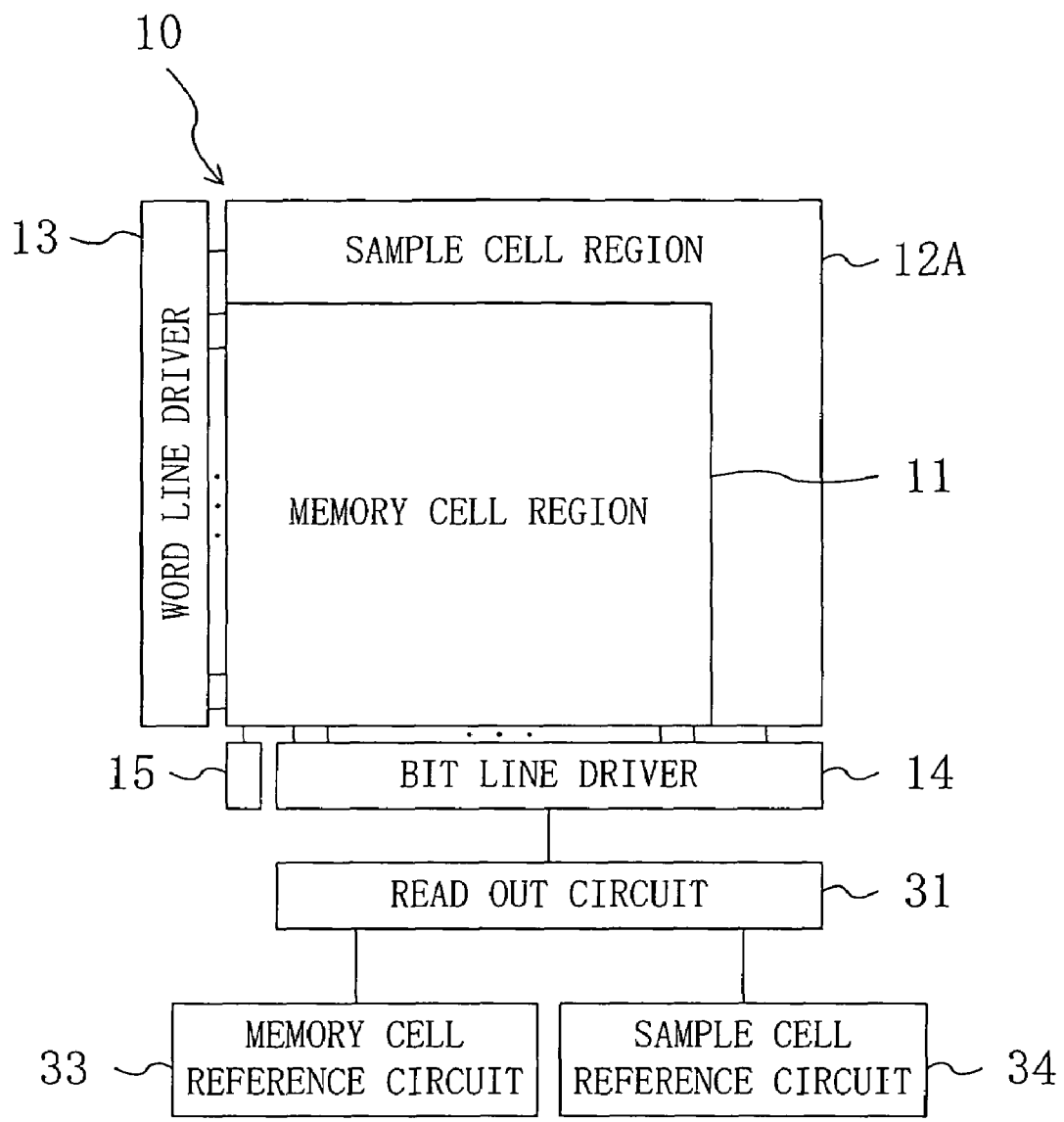
FIG. 13 is a block diagram showing a semiconductor memory device according to a fifth embodiment of the present invention.

FIG. 13 is a block diagram showing the semiconductor memory device according to the fifth embodiment. Referring to FIG. 13, a memory cell array 10 includes a memory cell region 11 for storing data and a sample cell region 12A for monitoring a stress applied in a disturb test. The memory cell array 10 is further provided with, as peripheral circuits for driving the memory cell array 10, a word line driver 13 for driving word lines and a sample cell word line, a bit line driver 14 for driving bit lines and a sample bit line, and a source line driver 15. The stage downstream of a read out circuit 31 is provided with a memory cell reference circuit 33 and a sample cell reference circuit 34 for verifying whether or not the threshold voltages of the memory cells and the reference cells after writing or erasing operation reach a predetermined level.

In the memory cell array 10, the memory cells of the memory cell region 11 and the sample cells of the sample cell region 12A are composed of the same members as the memory cell 20 shown in FIG. 4A.

In the fifth embodiment, the memory cell is subjected to a verification operation with the memory cell reference circuit 33, while the sample cell is subjected to a verification operation with the sample cell reference circuit 34. The sample cell reference circuit 34 defines, as a reference voltage for judging a cell to have data "0", a greater voltage value than the memory cell to the sample cell, and defines, as a reference voltage for judging a cell to have data "1", a smaller voltage value than the memory cell to the sample cell.

Therefore, using the amount of charges retained in the floating gate electrode in the neutral state (that is, an intermediate state between the state in which data "0" is retained and the state in which data "1" is retained) as the reference, the difference in the amounts of charges between the sample cell storing data "0" and the sample cell storing data "1" is widened more than the difference between the memory cell storing data "0" and the memory cell storing data "1".

In the memory cell and the sample cell, as the difference is widened between the amounts of charges stored in the neutral state and the amount of charges stored in the writing state or the erasing state, charges stored in the floating gate electrode transfer more easily by stress application.

By the burn-in process, the threshold voltage of the sample cell varies more greatly than that of the memory cell. Therefore, measurement of the threshold voltages of the sample cells with a tester or the like after the burn-in process can determine whether the applied stress is normal or not. If the sample cell retaining data "0" has a threshold voltage lower than $V_{S0}$ and the sample cell retaining data "1" has a threshold voltage higher than $V_{S1}$, the burn-in process can be judged to have applied a normal stress.

As described above, in the fifth embodiment, data writing operation or data erasing operation and verification operation on the former operation are performed before the burn-in process, whereby a difference can be created between the threshold voltages of the memory cell and the threshold voltage of the sample cell. Therefore, there is no need for the sample cell to use different members from the memory cell in order to create a difference in disturb characteristics between the memory cell and the sample cell during the burn-in process, and thus the fabrication process of the memory cell array 10 can be simplified as compared to the first embodiment.

In FIG. 13, the read out circuit 31 is illustrated as a different circuit from the memory cell reference circuit 33 and the sample cell reference circuit 34. However, the configuration of the fifth embodiment is not limited to this, and it is sufficient to have configuration in which individual reference voltages can be defined to the verification operation on the memory cell and the verification operation on the sample cell.

(Sixth Embodiment)

A semiconductor memory device according to a sixth embodiment of the present invention will be described below with reference to the accompanying drawings.

Figure 14:
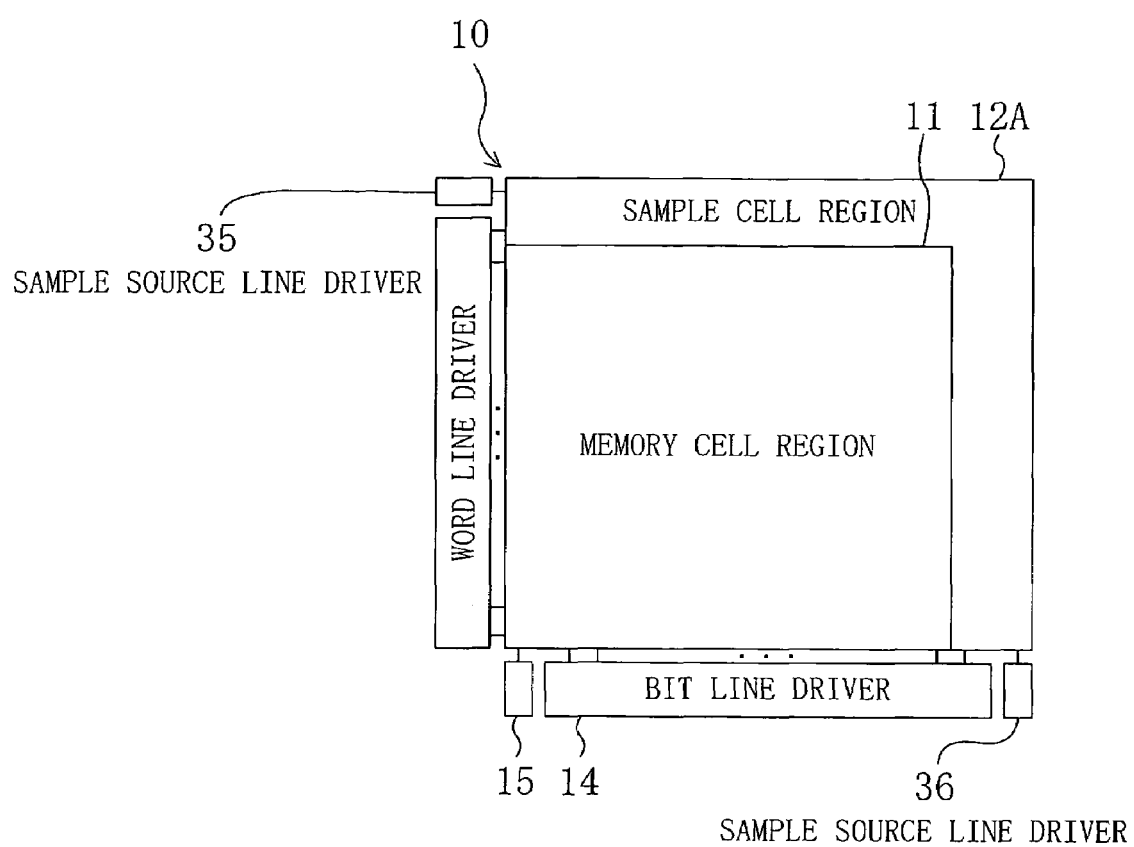
FIG. 14 is a block diagram showing a semiconductor memory device according to a sixth embodiment of the present invention.

FIG. 14 is a block diagram showing the semiconductor memory device according to the sixth embodiment. Referring to FIG. 14, a memory cell array 10 includes a memory cell region 11 and a sample cell region 12A. Memory cells of the memory cell region 11 and sample cells of the sample cell region 12A are composed of the same members. The memory cell array 10 is further provided with, as peripheral circuits for driving the memory cell array 10, a word line driver 13 for driving word lines and a sample cell word line, a bit line driver 14 for driving bit lines a sample bit line, a source line driver 15 for driving a source line in the memory cell region 11, and sample source line drivers 35 and 36 for driving sample source lines in the sample cell region.

Figure 15:
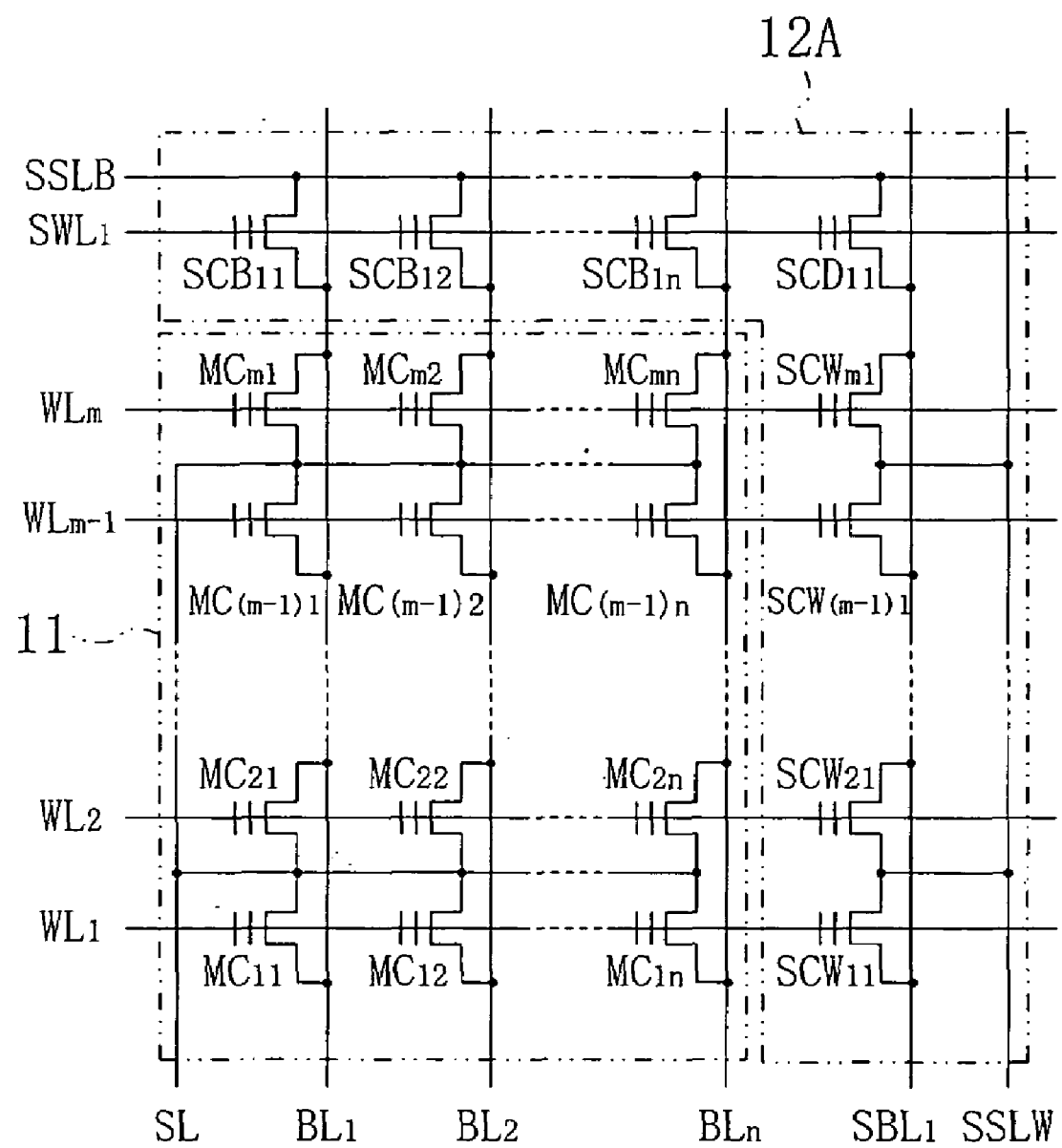
FIG. 15 is a circuit diagram showing a memory cell array of the semiconductor memory device according to the sixth embodiment of the present invention.

FIG. 15 is a circuit diagram showing the memory cell array 10 of the semiconductor memory device according to the sixth embodiment. Referring to FIG. 15, in the memory cell region 11, respective source electrodes of the memory cells $MC_{11}$ to $MC_{mn}$ are connected to a single source line SL. Respective source electrodes of the word line sample cells $SCW_{11}$ to $SCW_{m1}$ are connected to a sample source line SSLW, and respective source electrodes of the bit line sample cells $SCB_{11}$ to $SCB_{1n}$ are connected to a sample source line SSLB. The sample source lines SSLW and SSLB are connected to the sample source line drivers 35 and 36, respectively.

With the semiconductor memory device of the sixth embodiment, the sample source lines SSLW and SSLB can be controlled by the sample source line drivers 35 and 36 independently of the source line connected to the memory cells. Therefore, in the disturb test, a stress in the opposite direction to the stress applied to the word line or the bit line can be applied only to the source electrodes of the sample cells. This provides a difference in the amount of change in the threshold voltage between the memory cell and the sample cell even though the sample cell is composed of the same members as the memory cell.

(Seventh Embodiment)

A semiconductor memory device according to a seventh embodiment of the present invention will be described below with reference to the accompanying drawings.

Figure 16:
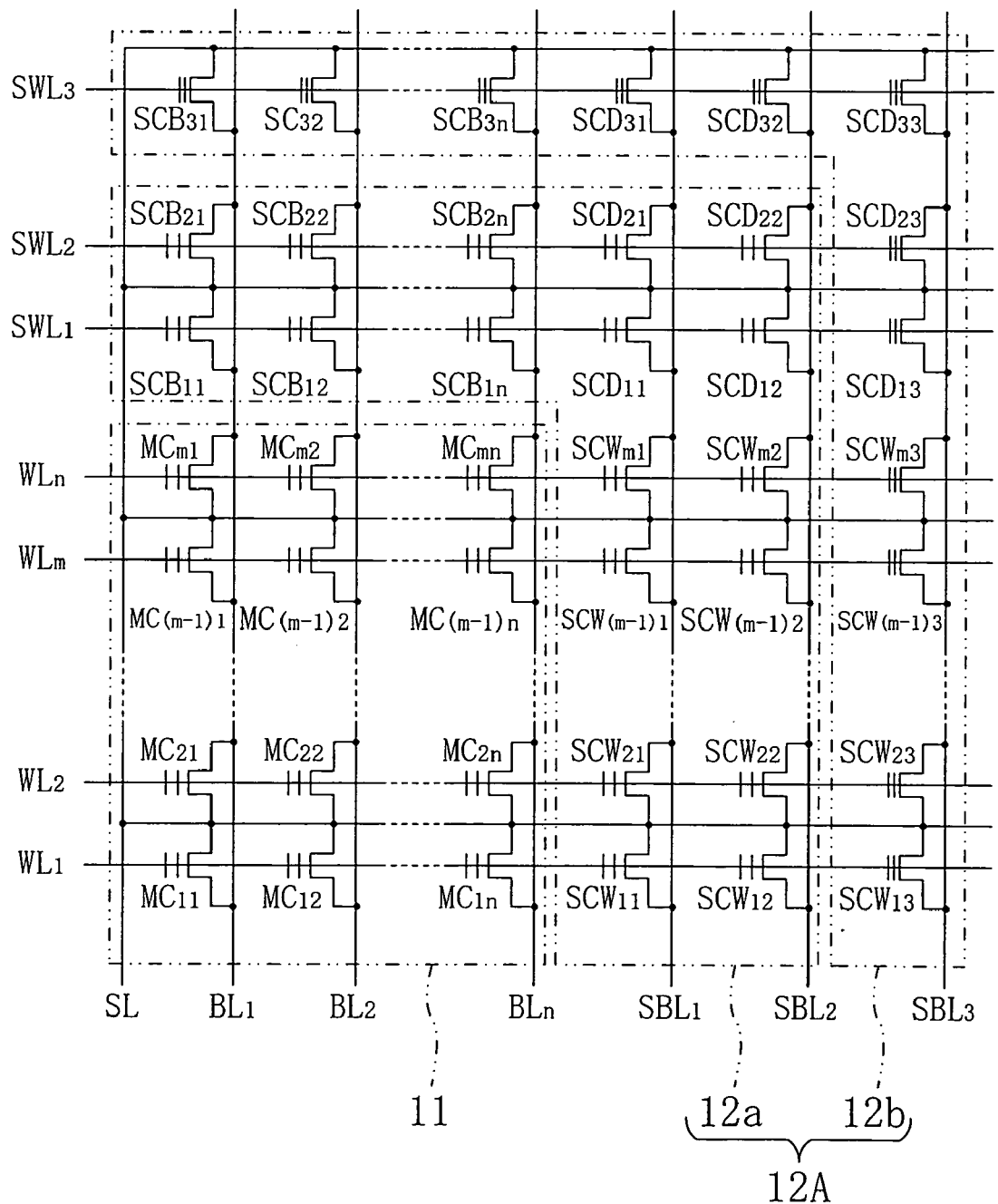
FIG. 16 is a circuit diagram showing a memory cell array of a semiconductor memory device according to a seventh embodiment of the present invention.
Figure 17:
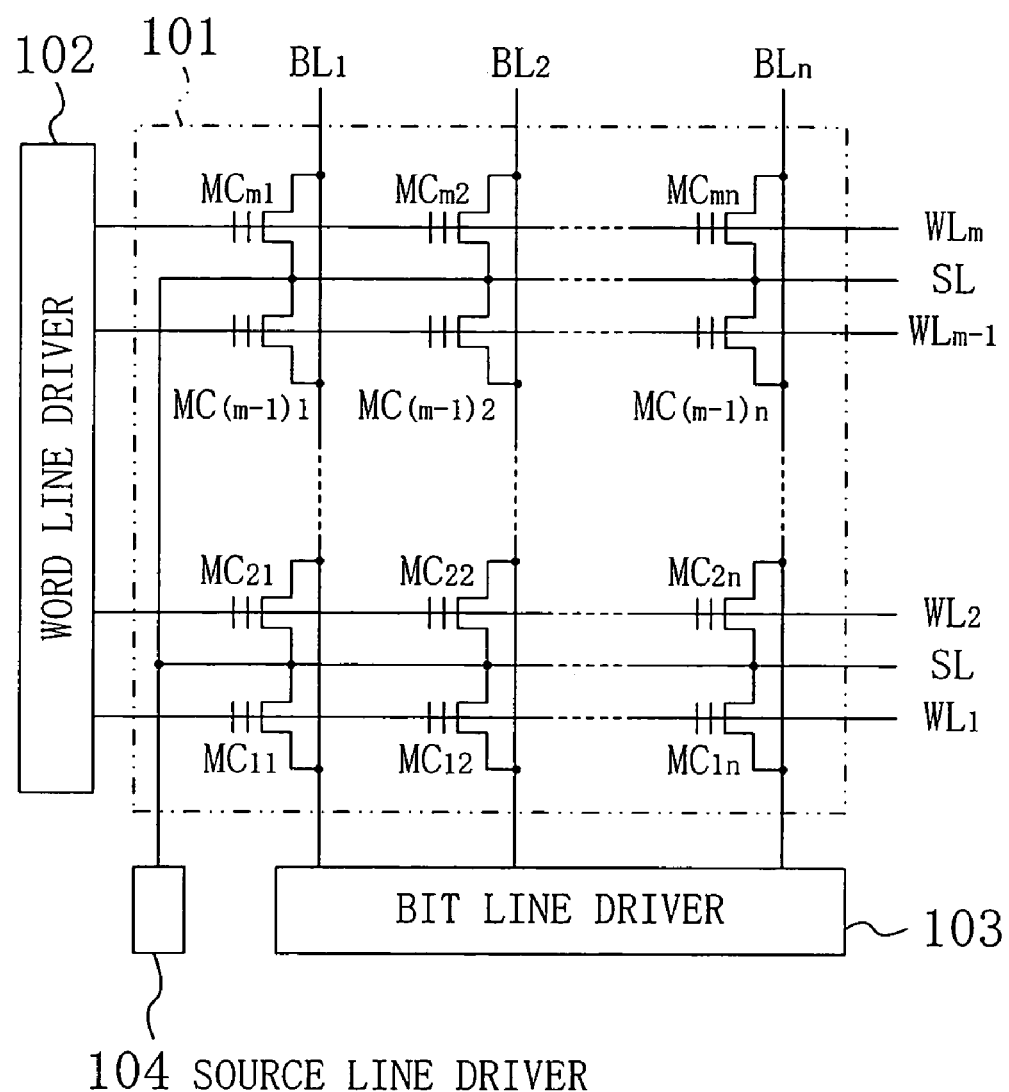
FIG. 17 is a block diagram showing a flash EEPROM according to a first conventional example.
Figure 18:
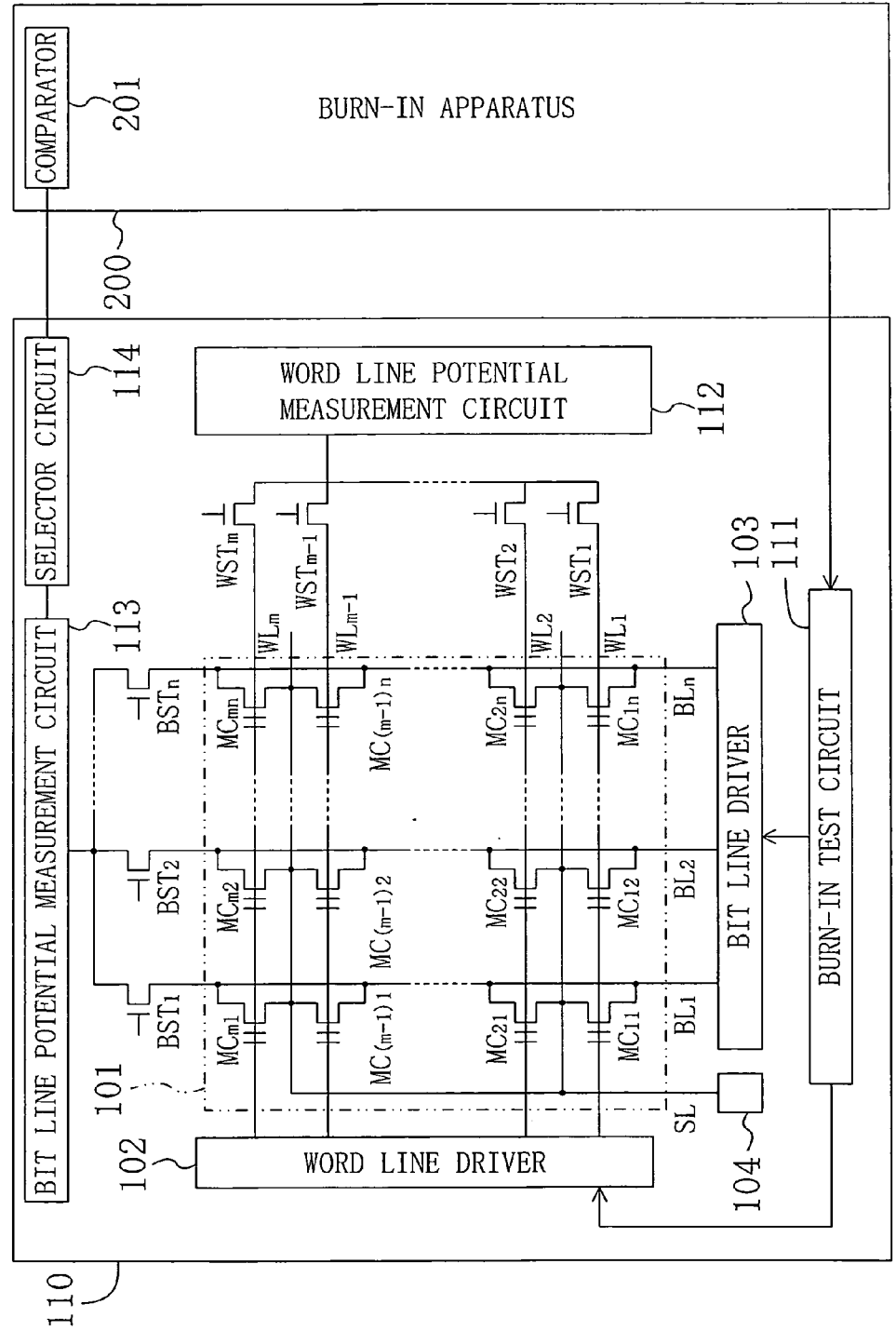
FIG. 18 is a block diagram showing how to conduct a disturb test on a flash EEPROM according to a second conventional example.

FIG. 16 is a circuit diagram showing a memory cell array of the semiconductor memory device according to the seventh embodiment.

Referring to FIG. 16, the memory cell array 10 includes a memory cell region 11, a first sample cell region 12a, and a second sample cell region 12b. Memory cells of the memory cell region 11 and sample cells of the first sample cell region 12a are composed of the same members as the memory cell 20 shown in FIG. 5A. Sample cells of the second sample cell region 12b are composed of the same members as the sample cell 30 shown in FIG. 5A.

The semiconductor memory device of the seventh embodiment has a block configuration similar to that of the fifth embodiment shown in FIG. 13. The first sample cell region 12a is subjected to a verification operation with the sample cell reference circuit 34, while the second sample cell region 12b is subjected to a verification operation with the memory cell reference circuit 33.

In the first sample cell region 12a, as a judgment voltage for judging a cell to have data "0", a greater voltage value than the memory cell is defined to the sample cell, and as a judgment voltage for judging a cell to have data "1", a smaller voltage value than the memory cell is defined to the sample cell. In this condition, verification operation is performed on the sample cells. Thus, using the neutral state as the reference, the sample cell is larger than the memory cell in the difference in the amounts of charges between the cell storing data "0" and the cell storing data "1".

It is sufficient that the sample cell of the second sample cell region 12b has a variation property of threshold voltage different from that of the memory cell of the memory cell region 11. Instead of the sample cell 30 shown in FIG. 5A, the sample cell of the second sample cell region 12b may be composed of the same members as the sample cell shown in FIG. 6A or the sample cell 30 shown in FIG. 7A.

As described above, in the semiconductor memory device according to the seventh embodiment, two types of sample cells are used, one of which (the word line sample cells $SCW_{11}$ to $SCW_{m2}$ and the bit line sample cells $SCB_{11}$ to $SCB_{2n}$) employs different members from the memory cell to control the threshold voltage of the sample cell, and the other of which (the word line sample cells $SCW_{13}$ to $SCW_{13}$ and the bit line sample cells $SCB_{31}$ to $SCB_{3n}$) conducts a different control from the memory cell to control the threshold voltage of the sample cell. This enables stress monitoring with two methods, thereby conducting a more precise disturb test.

What is claimed is:

1. A semiconductor memory device comprising:
   a plurality of first memory cells arranged in matrix;
   a control line connecting a subset of the plurality of first memory cells which are aligned in a row direction or a column direction; and
   a second memory cell connected to the control line,
   wherein the second memory cell in configured to retain information on a stress applied from the control line to each of the first memory cells,
   wherein the first memory cells and the second memory cells each have a floating gate electrode which in formed, as the charge storage portion, above a semiconductor substrate with a tunnel insulating film interposed therebetween, a control gate electrode formed above the floating gate electrode with a capacitor insulating film interposed therebetween, and a source electrode and a drain electrode provided to interpose a portion of the semiconductor substrate located below the floating gate electrode, and
   wherein the first memory cells differ from the second memory cells in the composition or the shape of at least one of the tunnel insulating film, the floating gate electrode, the capacitor insulating film, and the control gate electrode.

2. A semiconductor memory device comprising:
   a plurality of first memory cells arranged in matrix;
   a plurality of word lines each connecting a subset of the plurality of first memory cells which are aligned in a row direction;
   a plurality of bit lines each connecting a subset of the plurality of first memory cells which are aligned in a column direction; and
   a plurality of second memory cells which are connected to at least either of the word lines and the bit lines,
   wherein the first memory cells and the second memory cells each have a charge storage portion for storing charges, and
   when a common voltage applied to the word lines or the bit lines of the first memory cells and the second memory cells, the amount of change in charges in the second memory cells is larger than the amount of change in charges in the first memory cells.

3. A semiconductor memory device comprising:
   a plurality of first memory cells arranged in matrix;

a plurality of word lines each connecting a subset of the plurality of first memory cells which are aligned in a row direction;

a plurality of bit lines each connecting a subset of the plurality of first memory cells which are aligned in a column direction; and a plurality of second memory cells which are connected to at least either of the word lines and the bit lines, wherein the first memory cells and the second memory cells each have a charge storage portion for storing charges, wherein the first memory cells and the second memory cells each have a floating gate electrode which in formed, as the charge storage portion, above a semiconductor substrate with a tunnel insulating film interposed therebetween, a control gate electrode formed above the floating gate electrode with a capacitor insulating film interposed therebetween, and a source electrode and a drain electrode provided to interpose a portion of the semiconductor substrate located below the floating gate electrode, and wherein the first memory cells differ from the second memory cells in the composition or the shape of at least one of the tunnel insulating film, the floating gate electrode, the capacitor insulating film, and the control gate electrode, and when voltage application to the word lines or the bit lines changes the amount of charges stored in the charge storage portions of the first memory cells and the second memory cells, the amount of change in charges in the second memory cells is larger than the amount of change in charges in the first memory cells.

4. The device of claim 3, wherein the capacitor insulating films of the second memory cells have a lower resistivity than the capacitor insulating films of the first memory cells.

5. The device of claim 4, wherein the capacitor insulating films of the first memory cells are each formed as a stacked film containing a silicon oxide film and a silicon nitride film, and the capacitor insulating films of the second memory cells are each formed as a single layer film or a stacked film containing a silicon oxide film.

6. The device of claim 3, wherein the floating gate electrodes of the first memory cells are each formed to have a smooth upper surface, and the floating gate electrodes of the second memory cells are each formed to have an upper surface with projections and depressions.

7. The device of claim 3, wherein in terms of the ratio of the area in which the floating gate electrode and the control gate electrode face each other with the capacitor insulating film interposed therebetween to the area in which the semiconductor substrate and the floating gate electrode face each other with the tunnel insulating film interposed therebetween, the second memory cells are larger than the first memory cells.

8. The device of claim 3, further comprising switch means for separating electrical connections between the word lines or the bit lines and the second memory cells.

9. The device of claim 8, wherein the switch means is a fuse element.

10. The device of claim 8, wherein the switch means is a MIS transistor.

11. The device of claim 10, wherein at least one of the first memory cells stores control information with which turn-on or turn-off of the MIS transistor is controlled.

12. The device of claim 3, wherein the plurality of second memory cells are arranged with two or more being connected in serial on each of the word and/or bit lines.

13. The device of claim 12, further comprising an equalization circuit for equalizing pieces of data stored in the second memory cells connected in serial and supplying the equalization result.

14. The device of claim 3, wherein the plurality of second memory cells are arranged with two or more being connected in parallel on each of the word and/or bit lines.

15. The device of claim 14, further comprising switch transistors for controlling connections between the second memory cells and at least either of the word lines and the bit lines.

16. The device of claim 3, further comprising:
a first verification circuit for determining whether or not a writing operation or an erasing operation is normally performed on the first memory cells; and
a second verification circuit for determining whether or not a writing operation or an erasing operation is normally performed on the second memory cells.

17. A semiconductor memory device comprising:
a plurality of first memory cells arranged in matrix;
a plurality of word lines each connecting a subset of the plurality of first memory cells which are aligned in a row direction;
a plurality of bit lines each connecting a subset of the plurality of first memory cells which are aligned in a column direction; and
a plurality of second memory cells which are connected to at least either of the word lines and the bit lines,
further comprising:
a first verification circuit for determining whether or not a writing operation or an erasing operation is normally performed on the first memory cells; and
a second verification circuit for determining whether or not writing operation or an erasing operation is normally performed on the second memory cells,
wherein the first memory cells and the second memory cells each have a charge storage portion for storing charges, and
when voltage application to the word lines or the bit lines changes the amount of charges stored in the charge storage portions of the first memory cells and the second memory cells, the amount of change in charges in the second memory cells is larger than the amount of change in charges in the first memory cells, and
the first memory cells are formed of the same members as the second memory cells.

18. A semiconductor memory device comprising:
a plurality of first memory cells arranged in matrix;
a plurality of word lines each connecting a subset of the plurality of first memory cells which are aligned in a row direction;
a plurality of bit lines each connecting a subset of the plurality of first memory cells which are aligned in a column direction; and
a plurality of second memory cells which are connected to at least either of the word lines and the bit lines,
further comprising:
a first source line connected to source electrodes of the first memory cells; and a second source line connected to source electrodes of the second memory cells,
wherein the first memory cells and the second memory cells each have a charge storage portion for storing charges, and
when voltage application to the word lines or the bit lines changes the amount of charges stored in the charge storage portions of the first memory cells and the second memory cells, the amount of change in charges in the second memory cells is larger than the amount of change in charges in the first memory cells.

19. The device of claim 18, wherein the first memory cells are formed of the same members as the second memory cells.

20. A semiconductor memory device comprising:

a plurality of first memory cells arranged in matrix;

a plurality of word lines each connecting a subset of the plurality of first memory cells which are aligned in a row direction;

a plurality of bit lines each connecting a subset of the plurality of first memory cells which are aligned in a column direction; and a plurality of second memory cells which are connected to at least either of the word lines and the bit lines, and wherein the first memory cells and the second memory cells each have a charge storage portion for storing charges, and when voltage application to the word lines or the bit lines changes the amount of charges stored in the charge storage portions of the first memory cells and the second memory cells, the amount of change in charges in the second memory cells is larger than the amount of change in charges in the first memory cells, and the plurality of second memory cells are arranged with two or more being connected in serial on each of the word and/or bit lines, and the second memory cells connected in serial includes an identically-shaped cell formed of the same members as the first memory cells and a differently-shaped cell formed of different members from the first memory cells.

* * * * *